(12) United States Patent
Zhang et al.

(10) Patent No.: US 12,171,124 B2
(45) Date of Patent: Dec. 17, 2024

(54) DISPLAY SUBSTRATE AND PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Bo Zhang, Beijing (CN); Zhiwen Chu, Beijing (CN); Rong Wang, Beijing (CN); Zhenhua Zhang, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 615 days.

(21) Appl. No.: 17/417,775

(22) PCT Filed: Sep. 10, 2020

(86) PCT No.: PCT/CN2020/114556
§ 371 (c)(1),
(2) Date: Jun. 24, 2021

(87) PCT Pub. No.: WO2022/051994
PCT Pub. Date: Mar. 17, 2022

(65) Prior Publication Data
US 2022/0344448 A1    Oct. 27, 2022

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC .......... H10K 59/1315; H10K 59/1201; H10K 50/844; H10K 50/8426; H10K 59/122
See application file for complete search history.

(56) References Cited

U.S. PATENT DOCUMENTS

| 2015/0008400 A1 | 1/2015 | Kim |
| 2015/0228927 A1 | 8/2015 | Kim |
| 2019/0259967 A1 | 8/2019 | Yang |

(Continued)

FOREIGN PATENT DOCUMENTS

| CN | 104282724 A | 1/2015 |
| CN | 109686758 A | 4/2019 |

(Continued)

*Primary Examiner* — Douglas W Owens
(74) *Attorney, Agent, or Firm* — Ling Wu; Stephen Yang; Ling and Yang Intellectual Property

(57) ABSTRACT

The present disclosure provides a display substrate, a preparation method thereof and a display apparatus. The display substrate includes a display region and an edge region located around the display region; the edge region includes a composite insulating layer disposed on a substrate, a power cord disposed on the composite insulating layer and an isolation dam disposed on the power cord, wherein the isolation dam is provided with auxiliary power cords. Both an auxiliary power cord of the isolation dam adjacent to the display region and an auxiliary power cord of the isolation dam away from the display region are lapped on the power cord.

20 Claims, 11 Drawing Sheets

(56) References Cited

U.S. PATENT DOCUMENTS

| | | |
|---|---|---|
| 2020/0083306 A1 | 3/2020 | Choi et al. |
| 2020/0176550 A1 | 6/2020 | Youn et al. |
| 2020/0220097 A1 | 7/2020 | Song et al. |
| 2020/0220098 A1 | 7/2020 | Tsai et al. |
| 2021/0020733 A1 | 1/2021 | Saida et al. |
| 2021/0074796 A1 | 3/2021 | Mao et al. |
| 2021/0119178 A1* | 4/2021 | Song ................... H10K 50/86 |
| 2021/0335990 A1 | 10/2021 | Chen et al. |

FOREIGN PATENT DOCUMENTS

| | | |
|---|---|---|
| CN | 109728063 A | 5/2019 |
| CN | 109728200 A | 5/2019 |
| CN | 110429116 A | 11/2019 |
| CN | 110828489 A | 2/2020 |
| IN | 111211137 A | 5/2020 |
| WO | 2019187137 A1 | 10/2019 |

\* cited by examiner forming a composite insulating layer and a power cord disposed on the composite insulating layer in an edge region of a substrate — S1 forming an isolation dam on a side of the power cord away from the substrate, wherein the isolation dam is provided with an auxiliary power cord, and both an auxiliary power cord of the isolation dam adjacent to the display region and an auxiliary power cord of the isolation dam away from the display region are lapped on the power cord — S2

FIG. 28

DISPLAY SUBSTRATE AND PREPARATION METHOD THEREOF, AND DISPLAY APPARATUS

TECHNICAL FIELD

The present disclosure relates to, but is not limited to, the field of display technology, in particular to a display substrate and a preparation method thereof, and a display apparatus.

BACKGROUND

An Organic Light Emitting Diode (abbreviated as OLED) is an active light emitting display component, and has advantages of self-light-emission, wide viewing angle, high contrast, low power consumption, extremely high response speed, lightness and thinness, flexibility and low cost etc. With the continuous development of display technology, the flexible display apparatus with OLED as a light-emitting apparatus and film Transistor (TFT) to perform signal control has become the mainstream product in the present display field.

SUMMARY

The following is a summary of subject matter described in detail herein. This summary is not intended to limit the protection scope of the claims.

The present disclosure provides a display substrate, which includes a display region and an edge region located around the display region; the edge region includes a composite insulating layer disposed on a substrate, a power line disposed on the composite insulating layer and an isolation dam disposed on the power line, wherein the isolation dam is provided with auxiliary power lines. An auxiliary power line located at a side of the isolation dam adjacent to the display region and an auxiliary power line located at a side of the isolation dam away from the display region are lapped on the power line.

In an exemplary embodiment, the isolation dam includes a first isolation dam and a second isolation dam, wherein the second isolation dam is disposed on the power line, the first isolation dam is disposed on an auxiliary power line of a side of the second isolation dam adjacent to the display region, and the second isolation dam is provided with the auxiliary power lines, wherein an auxiliary power line is located at a side of the second isolation dam adjacent to the display region and an auxiliary power line located at a side of the second isolation dam away from the display region are both lapped on the power line.

In an exemplary embodiment, the edge region further includes second connection electrodes, which are disposed in the first isolation dam, and a second connection electrode located at a side of the first isolation dam adjacent to the display region and a second connection electrode located at a side of the first isolation dam away from the display region are lapped on the auxiliary power line.

In an exemplary embodiment, the second isolation dam further includes a first dam foundation, a third dam foundation and a fifth dam foundation; wherein the first dam foundation is disposed on the power line, and includes a first surface away from the power line, a first proximal side adjacent to the display region and a first distal side away from the display region; the auxiliary power lines all cover the first surface, the first proximal surface and the first distal surface of the first dam foundation; the third dam foundation is disposed on the auxiliary power line covering the first surface, and the fifth dam foundation is disposed on the third dam foundation.

In an exemplary embodiment, the second isolation dam further includes a first dam foundation, a third dam foundation and a fifth dam foundation; the first dam foundation is disposed on the power line, and includes a first surface away from the power line, a first proximal side adjacent to the display region and a first distal side away from the display region; the auxiliary power lines all cover the first proximal side and the first distal side of the first dam foundation and partially cover the first surface of the first dam foundation, the third dam foundation is disposed on the auxiliary power lines partially covering the first surface, and the fifth dam foundation is disposed on the third dam foundation; or, the auxiliary power lines all cover the first proximal side and the first distal side of the first dam foundation, the third dam foundation is disposed on the first surface of the first dam foundation, and the fifth dam foundation is disposed on the third dam foundation.

In an exemplary embodiment, an auxiliary power line in the second isolation dam is provided with a first deflation structure, and an orthographic projection of the first deflation structure on the substrate is within an orthographic projection range of the first surface on the substrate.

In an exemplary embodiment, the first deflation structure includes at least one first through hole, and a first length of the first through hole is 80%-100% of a first length of the first surface, a second length of the first through hole is 20%-60% of the first length of the first through hole, and a distance between adjacent first through holes is 20%-60% of the first length of the first through hole; the first length is a feature size along a direction away from the display region, and the second length is a feature size along an edge direction of the display region.

In an exemplary embodiment, the first isolation dam further includes a second dam foundation and a fourth dam foundation; the second dam foundation is disposed on the auxiliary power line, and includes a second surface away from the power line, a second proximal side adjacent to the display region and a second distal side away from the display region; the second connection electrode completely covers the second surface, the second proximal side and the second distal side of the second dam foundation; the fourth dam foundation is disposed on the second connection electrode covering the second surface.

In an exemplary embodiment, the first isolation dam further includes a second dam foundation and a fourth dam foundation; the second dam foundation is disposed on the auxiliary power line, and includes a second surface away from the power line, a second proximal side adjacent to the display region and a second distal side away from the display region; the second connection electrode completely covers the second proximal side and the second distal side of the second dam foundation, partially covers the second surface of the second dam foundation, and the fourth dam foundation is disposed on the second connection electrode partially covering the second surface; or, the second connection electrode completely covers the second proximal side and the second distal side of the second dam foundation, and the fourth dam foundation is disposed on the second surface of the second dam foundation.

In an exemplary embodiment, a second connection electrode in the first isolation dam is provided with a second deflation structure, and an orthographic projection of the second deflation structure on the substrate is within an orthographic projection range of the second surface on the substrate.

In an exemplary embodiment, the second deflation structure includes at least one second through hole; a first length of the second through hole is 80%-100% of a first length of the second surface, a second length of the second through hole is 20%-60% of the first length of the second through hole, and a distance between adjacent second through holes is 20%-60% of the first length of the second through hole; the first length is a feature size along a direction away from the display region, and the second length is a feature size along an edge direction of the display region.

In an exemplary embodiment, the second isolation dam further includes a first passivation dam foundation; the first passivation dam foundation is disposed on the power line, and the first dam foundation is disposed on the first passivation dam foundation.

In an exemplary embodiment, the first isolation dam further includes a second passivation dam foundation; the second passivation dam foundation is disposed on the power line, and the auxiliary power line covers the second passivation dam foundation; and the second dam foundation is disposed on an auxiliary power line covering the second passivation dam foundation.

In an exemplary embodiment, the first isolation dam further includes a second passivation dam foundation, and the second isolation dam further includes a first passivation dam foundation; the second passivation dam foundation is disposed on the power line, the auxiliary power line covers the second passivation dam foundation, and the second dam foundation is disposed on the auxiliary power line covering the second passivation dam foundation; the first passivation dam foundation is disposed on the power line, and the first dam foundation is disposed on the first passivation dam foundation.

In an exemplary embodiment, the first isolation dam further includes a planarization dam foundation; the planarization dam foundation is disposed on the power line, and the auxiliary power line covers the planarization dam foundation; and the second dam foundation is disposed on an auxiliary power line covering the planarization dam foundation.

In an exemplary embodiment, the planarization dam foundation is disposed in a same layer as the first dam foundation, and a thickness of the planarization dam foundation is 30% to 70% of that of the first dam foundation.

In an exemplary embodiment, the display region includes a drive structure layer disposed on a substrate and light emitting elements disposed on the drive structure layer; the power line is disposed in a same layer as a first source and drain metal layer of the drive structure layer, the auxiliary power line is disposed in a same layer as a second source and drain metal layer of the drive structure layer, and the second connection electrode is disposed in a same layer as an anode of the light emitting element.

The present disclosure further provides a display apparatus, including the display substrate described above.

The present disclosure also provides a preparation method for a display substrate, which includes a display region and an edge region located around the display region; wherein the preparation method includes:
  forming a composite insulating layer and a power line disposed on the composite insulating layer in an edge region of a substrate;
  forming an isolation dam on a side of the power line away from the substrate, wherein the isolation dam is provided with auxiliary power lines, and both an auxiliary power line of a side of the isolation dam adjacent to the display region and an auxiliary power line of a side of the isolation dam away from the display region are lapped on the power line.

In an exemplary embodiment, an isolation dam is formed on the power line, and the isolation dam is provided with auxiliary power lines, including:
  forming a first dam foundation on the power line;
  forming the auxiliary power lines on the power lines and the first dam foundation, wherein a first side of the auxiliary power line adjacent to the display region and a second side of the auxiliary power line away from the display region are lapped on the power line, and an auxiliary power line between the first side and the second side cover the first dam foundation;
  forming a second dam foundation and a third dam foundation, wherein the third dam foundation is disposed on an auxiliary power line covering the first dam foundation, and the second dam foundation is disposed on an auxiliary power line between the first dam foundation and the display region;
  forming a second connection electrode lapped with the auxiliary power line, wherein the second connection electrode covers the second dam foundation;
  forming a fourth dam foundation and a fifth dam foundation, wherein the fourth dam foundation is disposed on the second connection electrode covering the second dam foundation, and the fifth dam foundation is disposed on the third dam foundation; the second dam foundation, the second connection electrode and the fourth dam foundation form a first isolation dam, and the first dam foundation, the auxiliary power line, the third dam foundation and the fifth dam foundation form a second isolation dam.

Other aspects will become apparent upon reading and understanding accompanying drawings and the detailed description.

BRIEF DESCRIPTION OF DRAWINGS

Drawings are used to provide a further understanding of technical solutions of the present disclosure and form a part of the description to explain the technical solutions of the present disclosure together with embodiments of the present disclosure, which do not constitute any limitation on the technical solutions of the present disclosure. Shapes and sizes of the components in the drawings do not reflect true proportions and only to be used to schematically illustrate contents of the present disclosure.

FIG. 28 is a flow chart of a preparation method for a display substrate according to an exemplary embodiment of the present disclosure.

Illustration of Reference Signs:

Figure 1:
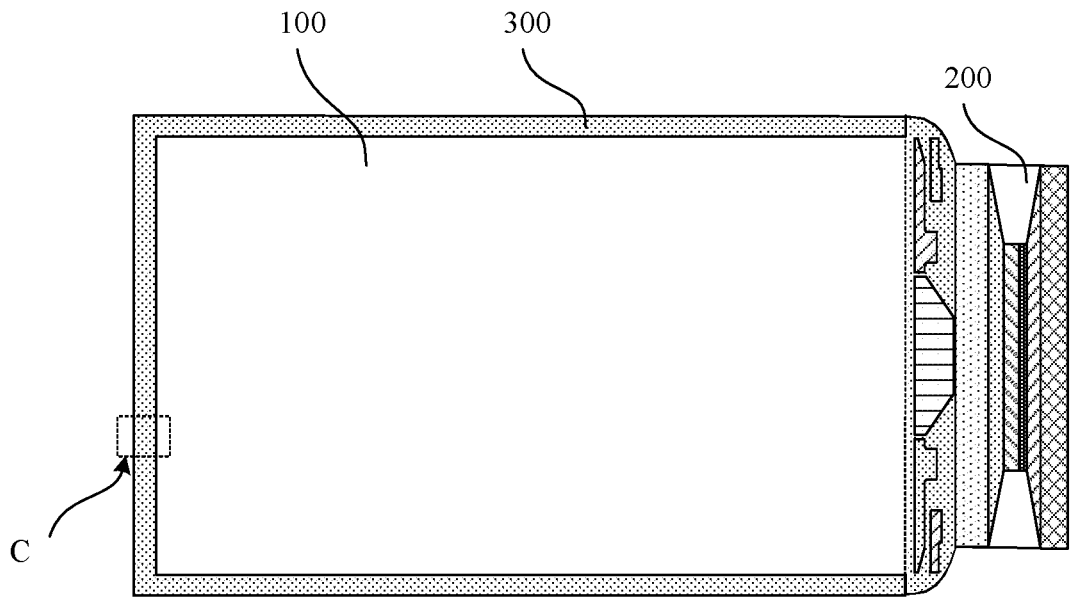
FIG. 1 is a schematic structural diagram of a display substrate.

1—glass carrier plate;
10—substrate;
11—first insulating layer;
12—second insulating layer;
13—third insulating layer;
14—fourth insulating layer;
15—fifth insulating layer;
16—first planarization layer;
17—second planarization layer;
21—anode;
22—pixel define layer;

Illustration of Reference Signs:

23—post spacer;
24—organic light emitting layer;
25—cathode;
26—encapsulation layer;
100—display region;
101—first transistor;
102—second transistor;
103—third transistor;
104—first storage capacitor;
105—second storage capacitor;
106—first connection electrode;
107—second connection electrode;
200—bonding region;
300—edge region;
301—circuit region;
302—isolation dam region;
303—crack dam region;
304—cutting region;
310—power cord;
320—auxiliary power cord;
401—first dam foundation;
402—second dam foundation;
403—third dam foundation;
404—fourth dam foundation;
405—fifth dam foundation;
410—first isolation dam;
411—first passivation dam foundation;
420—second isolation dam;
421—second passivation dam foundation;
431—planarization dam foundation.

DETAILED DESCRIPTION

To make the objects, technical solutions and advantages of the present disclosure more clear, embodiments of the present disclosure will be described in detail below with reference to the drawings. It should be noted that the embodiments may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, sizes of constituent elements and thicknesses and regions of layers are sometimes exaggerated for clarity. Therefore, an implementation of the present disclosure is not necessarily limited to the sizes shown. The shapes and sizes of components in the drawings do not reflect true proportions. In addition, the drawings schematically show ideal examples, and an implementation of the present disclosure is not limited to the shapes or values shown in the drawings.

The ordinal numbers "first", "second", "third" and the like in this specification are used to avoid confusion between constituent elements, but not to constitute limitations on quantities.

In this specification, for sake of convenience, wordings such as "central", "upper", "lower", "front", "rear", "vertical", "horizontal", "top", "bottom", "inner", "outer" and the like describe the orientation or positional relations of constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations of the constituent elements are appropriately changed according to the direction in which each constituent element is described. Therefore, they are not limited to the wordings in the specification, and may be replaced appropriately according to the situations.

In this specification, terms "installed", "connected" and "coupled" shall be understood in a broad sense unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. For those of ordinary skills in the art, the specific meanings of the above terms in the present disclosure may be understood according to specific situations.

In this specification, a transistor refers to an element including at least three terminals, namely a gate electrode, a drain electrode and a source electrode. The transistor has a channel region between the drain electrode (also referred to as a drain terminal, a drain region or a drain electrode) and the source electrode (also referred to as a source electrode terminal, a source region or a source electrode), and current can flow through the drain electrode, the channel region and the source electrode. It should be noted that in this specification, the channel region refers to a region through which current mainly flows.

In this specification, a first electrode may be a drain electrode and a second electrode may be a source electrode, or the first electrode may be a source electrode and the second electrode may be a drain electrode. The functions of the "source electrode" and that of the "drain electrode" are interchangeable under circumstances where transistors with opposite polarities are used or where the current direction changes during circuit operation. Therefore, in this specification, "source electrode" and "drain electrode" are interchangeable.

In this specification, an "electrical connection" includes a case where constituent elements are connected together through an element having certain electrical action. The "element having a certain electrical action" is not particularly limited as long as it can transmit and receive electrical signals between connected constituent elements. Examples of the "elements having certain electrical function" include not only electrodes and wiring, but also switching elements such as transistors, resistors, inductors, capacitors, and other elements having various functions.

In this specification, "parallel" refers to a state in which two straight lines form an angle above −10 degrees and below 10 degrees, and thus also includes a state in which the angle is above −5 degrees and below 5 degrees. In addition, "vertical" refers to a state in which two straight lines form an angle between 80 degrees and 100 degrees and thus, includes a state in which the angle is between 85 and 95 degrees.

In this specification, "film" and "layer" are interchangeable. For example, sometimes "conductive layer" may be replaced by "conductive film". Similarly, "insulating film" may sometimes be replaced by "insulating layer".

In the present specification, "about" means that there is not strict limit for a value, and values within an error range during processes and measurement are allowed.

FIG. 1 is a schematic diagram of a structure of a display substrate. As shown in FIG. 1, in an exemplary embodiment, the display substrate includes a display region 100, a bonding region 200 located on a side of the display region 100, and an edge region 300 located on an other side of the display region 100. The display region 100 at least includes a plurality of display units (sub-pixels) disposed regularly, the bonding region 200 at least includes isolation dams and bonding circuits connecting signal lines of plurality of display units to an external drive apparatus, and the edge region 300 at least includes isolation dams, gate drive circuits and second power lines VSS for transmitting voltage signals to the plurality of display units. The isolation dams of the bonding region 200 and the edge region 300 form an annular structure surrounding the display region 100.

In an exemplary embodiment, in a direction perpendicular to the display substrate, the display unit includes a drive structure layer disposed on the substrate, a light emitting element disposed on the drive structure layer and an encapsulation layer disposed on the light emitting element. The drive structure layer includes a pixel drive circuit, the light emitting element is connected to the pixel drive circuit, the light emitting element is configured to emit lights, and the pixel drive circuit is configured to drive the light emitting element. In an exemplary embodiment, the pixel drive circuit may include a plurality of thin film transistors (abbreviated as TFT) and a plurality of storage capacitors, such as 3T1C, 4T1C, 5T1C, 6T1C or 7T1C, which is not limited in the present disclosure.

Figure 2:
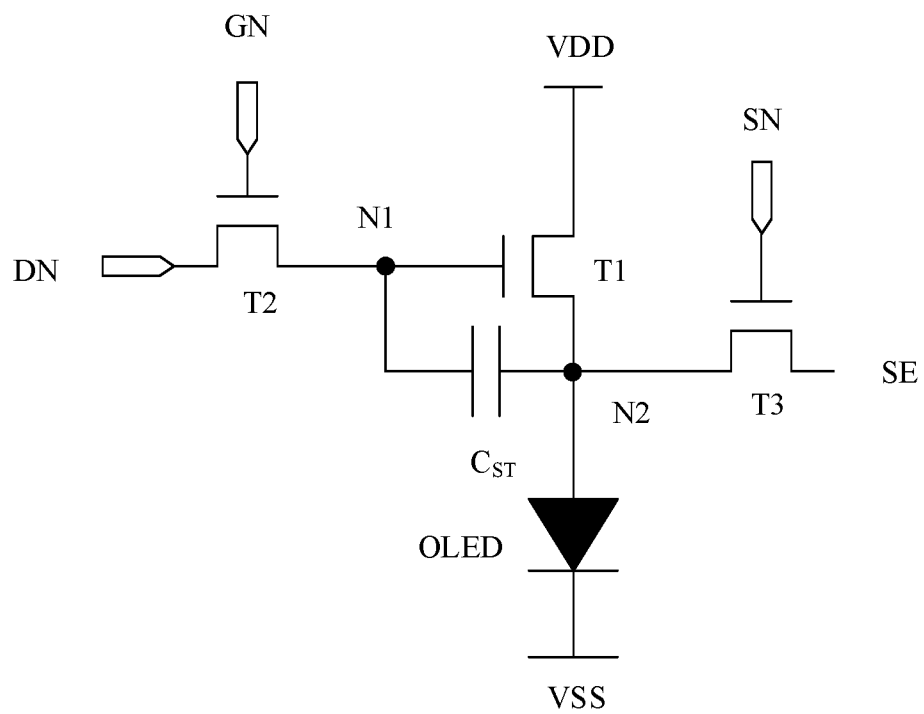
FIG. 2 is an equivalent circuit schematic diagram of an OLED pixel drive circuit.

FIG. 2 is a schematic diagram of an equivalent circuit of an OLED pixel drive circuit, illustrating a 3T1C drive structure. As shown in FIG. 2, the pixel drive circuit is electrically connected to a first scan line GN, a second scan line SN, a data line DN, the first power line VDD and a compensation line SE, and includes a first transistor T1, a second transistor T2, a third transistor T3 and a storage capacitor Csr. In an exemplary embodiment, the first transistor T1 is a drive transistor, the second transistor T2 is a switch transistor, and the third transistor T3 is a compensation transistor. In an exemplary embodiment, a gate electrode of the first transistor T1 is connected to a second electrode of the second transistor T2 and a first electrode of the storage capacitor Csr, a first electrode of the first transistor T1 is connected to the first power line VDD, and a second electrode of the first transistor T1 is connected to a second electrode of the storage capacitor Csr and a second electrode of the third transistor T3. A gate electrode of the second transistor T2 is connected to the scan line GN, and a first electrode of the second transistor T2 is connected to the data line DN. A gate electrode of the third transistor T3 is connected to the second scan line SN, and a first electrode of the third transistor T3 is connected to the compensation line SE. An anode of an OLED is connected to a second electrode of the first transistor T1, and a cathode of the OLED is connected to a second power line VSS. The OLED is configured to emit light with corresponding brightness in response to a current of the second electrode of the first transistor T1. Among the exemplary embodiments, the third transistor T3 may extract a threshold voltage Vth and mobility of the first transistor T1 in response to a compensated timing sequence to compensate the threshold voltage Vth, and the storage capacitor $C_{ST}$ is configured to maintain voltages of a node N1 and a node N2 in one frame of light emission period.

Figure 3:
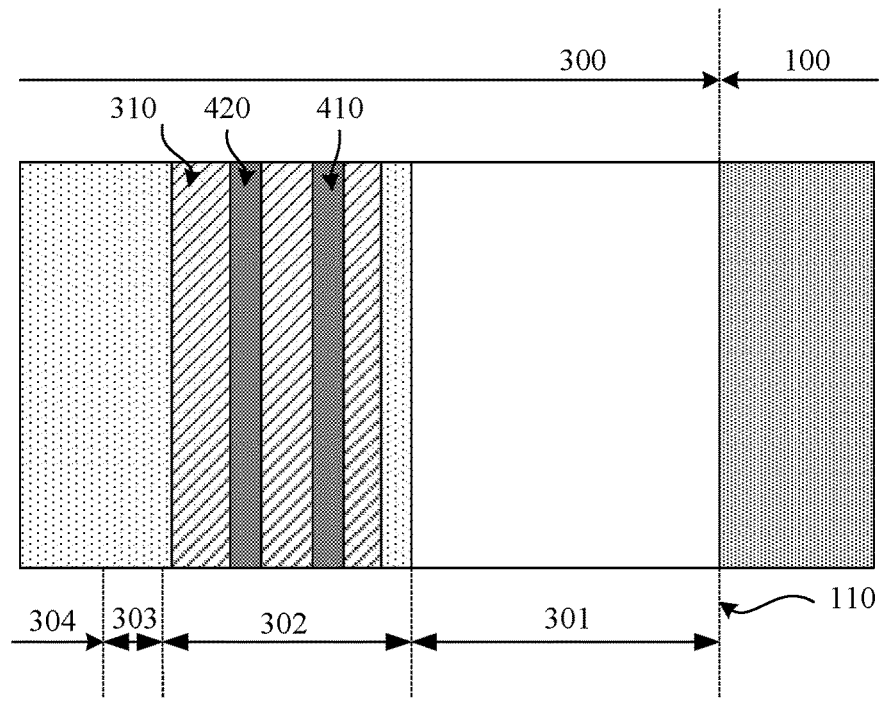
FIG. 3 is a schematic structural diagram of an edge region of a display substrate.

FIG. 3 is a schematic structural diagram of an edge region of a display substrate, which is an enlarged view of a C region in FIG. 1. As shown in FIG. 3, in a direction parallel to the display substrate, the edge region 300 includes a circuit region 301, an isolation dam region 302, a crack dam region 303 and a cutting region 304 which are sequentially disposed along a direction away from the display region 100. In an exemplary embodiment, the circuit region 301 at least includes a gate drive circuit which is connected to a first scan line and a second scan line of a pixel drive circuit in the display region 100. The isolation dam region 302 at least includes a power line 310, a first isolation dam 410 and a second isolation dam 420. The power line 310 extends in a direction parallel to an edge 110 of the display region and is connected to the second power line VSS of the pixel drive circuit in the display region 100. The first isolation dam 410 and the second isolation dam 420 extend in the direction parallel to the edge 110 of the display region and are configured to block water vapor entering the display region 100 from the edge region 300. A distance between the first isolation dam 410 and the display region edge 110 is smaller than that between the second isolation dam 420 and the display region edge 110, that is, the second isolation dam 420 is disposed on a side of the first isolation dam 410 away from the display region 100. In an exemplary embodiment, the crack dam region 303 includes a plurality of cracks disposed on a composite insulating layer, which are configured to reduce stress of the display region 100 and the circuit region 301 during a cutting process, thereby avoiding affecting film structures of the display region 100 and the circuit region 301. Cut-off cracks are transmitted to a direction of the display region 100 and the circuit region 301. In an exemplary embodiment, the cutting region 304 includes cutting grooves disposed on the composite insulating layer, and the cutting grooves are configured to be cut respectively along the cutting groove by a cutting device after all film layers of the display substrate are prepared. In an exemplary embodiment, the display region edge 110 is an edge of the display region 100 adjacent to the edge region 300.

In an exemplary embodiment, a low voltage (VSS) required by the pixel drive circuit in the display region 100 is introduced from a bonding pad of the bonding region 200, enters the edge region 300 after passing through bonding region 200, and is transmitted to the second power line VSS of each pixel drive circuit through the annular power line 310 of the edge region 300. Because there is certain impedance in the power line and there is voltage drop in voltage signal transmission, the voltage of the power line 310 away from the bonding region 200 will be lower than that of the power line 310 near the bonding region 200. Voltage loss of the power line 310 reduces uniformity of display brightness in the display region, which has become an important factor affecting high-quality display.

In order to improve the uniformity of display brightness, the present disclosure provides a display substrate, in a direction parallel to the display substrate, the display substrate includes a display region and an edge region located around the display region; the edge region includes a composite insulating layer disposed on a substrate, a power line disposed on the composite insulating layer and an isolation dam disposed on the power line, wherein the isolation dam is provided with auxiliary power lines. An auxiliary power line located at a side of the isolation dam adjacent to the display region and an auxiliary power line located at a side of the isolation dam away from the display region are lapped on the power line.

In an exemplary embodiment, the isolation dam includes a first isolation dam and a second isolation dam, wherein the second isolation dam is disposed on the power line, the first isolation dam is disposed on an auxiliary power line of a side of the second isolation dam adjacent to the display region, and the second isolation dam is provided with the auxiliary power lines, wherein an auxiliary power line located at a side of the second isolation dam adjacent to the display region and an auxiliary power line located at a side of the second isolation dam away from the display region are both lapped on the power line.

In an exemplary embodiment, the edge region further includes second connection electrodes, which are disposed in the first isolation dam, and a second connection electrode located at a side of the first isolation dam adjacent to the display region and a second connection electrode located at a side of the first isolation dam away from the display region are lapped on the auxiliary power line.

In an exemplary embodiment, the second isolation dam may include a first dam foundation, an auxiliary power line, a third dam foundation and a fifth dam foundation, or include a first passivation dam foundation, a first dam foundation, an auxiliary power line, a third dam foundation and a fifth dam foundation.

In an exemplary embodiment, the auxiliary power line in the second isolation dam is provided with a first deflation structure.

In an exemplary embodiment, the first isolation dam may include a second dam foundation, a second connection electrode and a fourth dam foundation, or include a second passivation dam foundation, an auxiliary power line, a second dam foundation, a second connection electrode and a fourth dam foundation, or include a planarization dam foundation, an auxiliary power line, a second dam foundation, a second connection electrode and a fourth dam foundation.

In an exemplary embodiment, the second connection electrode in the first isolation dam is provided with a second deflation structure.

The display region includes a drive structure layer disposed on a substrate and light emitting elements disposed on the drive structure layer; the power line is disposed in a same layer as a first source and drain metal layer of the drive structure layer, the auxiliary power line is disposed in a same layer as a second source and drain metal layer of the drive structure layer, and the second connection electrode is disposed in a same layer as an anode of the light emitting element.

In an exemplary embodiment, the first dam foundation is disposed in a same layer as a first planarization layer of the drive structure layer, the second dam foundation and the third dam foundation are disposed in a same layer as a second planarization layer of the drive structure layer, and the fourth dam foundation and the fifth dam foundation are disposed in a same layer as a pixel define layer of the light emitting element. The composite insulating layer includes a first insulating layer, a second insulating layer, a third insulating layer, and a fourth insulating layer that are stacked.

In an exemplary embodiment, the first passivation dam foundation and the second passivation dam foundation are disposed in a same layer as the fifth insulation layer, and the planarization dam foundation is disposed in a same layer as the first dam foundation, and a thickness of the planarization dam foundation is 30% to 70% of that of the first dam foundation.

In an exemplary embodiment, the edge region includes a circuit region, an isolation dam region, a crack dam region and a cutting region which are sequentially disposed along a direction away from the display region, wherein the power line, the auxiliary power line and the isolation dam are disposed in the isolation dam region, the crack dam region is provided with a crack dam, and the cutting region is provided with cutting grooves.

According to the display substrate provided by the present disclosure, the power line and the auxiliary power line are formed in the edge region to achieve a double-layer power wiring in a parallel structure, reduce a resistance of the power wiring in the edge region, reduce the voltage drop of the voltage signal to the utmost extent, and improve the uniformity of the display brightness in the display region and the display quality.

Figure 4:
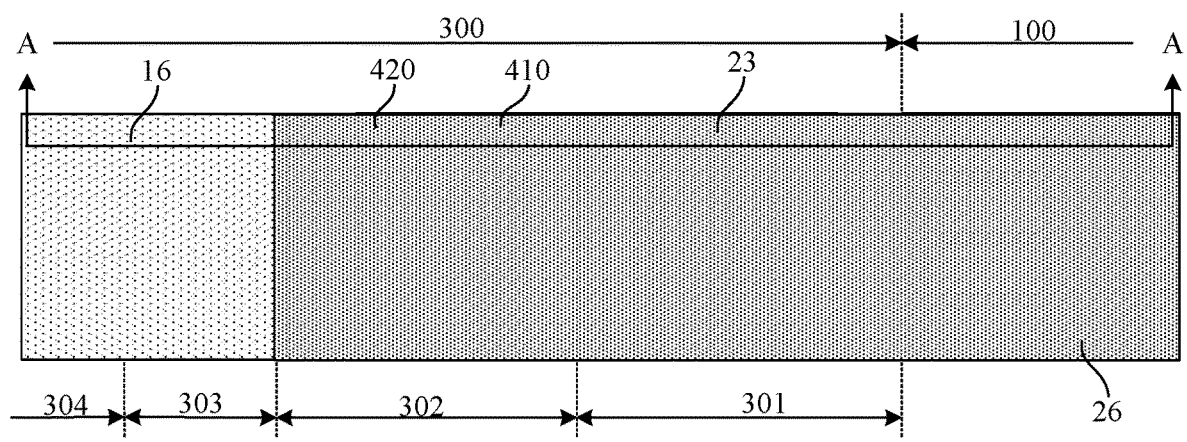
FIG. 4 is a schematic structural diagram of a display substrate according to an exemplary embodiment of the present disclosure.
Figure 5:
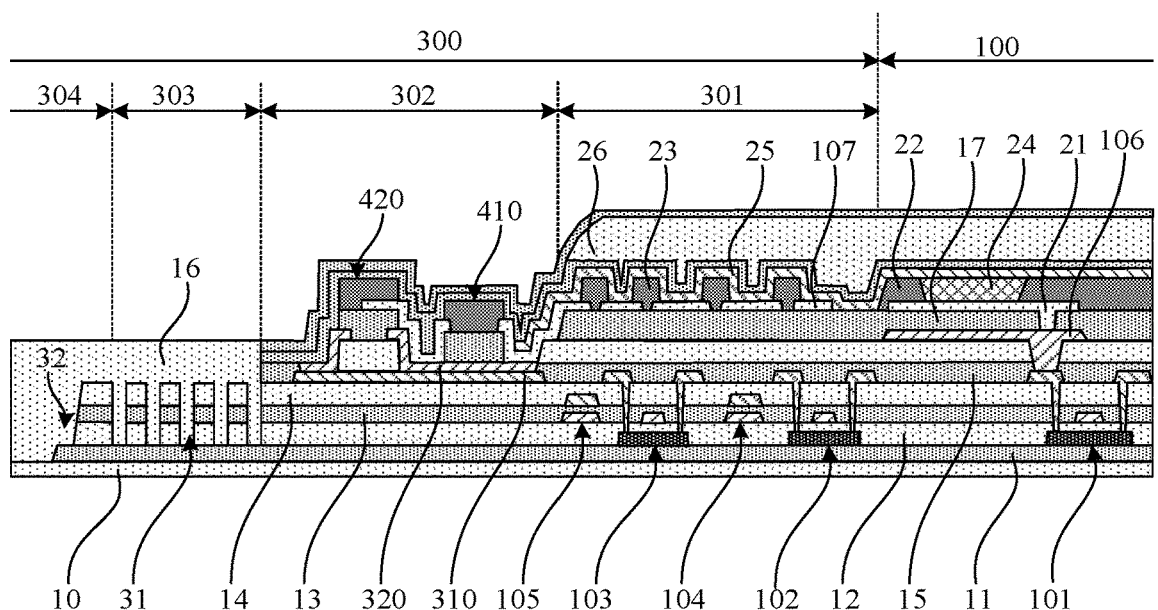
FIG. 5 is a sectional view taken along an A-A direction in FIG. 4.

FIG. 4 is a schematic structural diagram of a display substrate according to an exemplary embodiment of the present disclosure, and FIG. 5 is a sectional view taken along an A-A direction in FIG. 4 illustrating a cross-sectional structure of a top-emission OLED display region and a peripheral region. According to a light emission direction, OLED can be categorized as a bottom-emission type, a top-emission type and a double-sided emission type. Compared with bottom-emission OLED, top-emission OLED has advantages of high aperture ratio, high color purity and easy to achieve high pixels per inch (abbreviated as PPI), which has gradually become a mainstream structure at present. For the top-emission OLED, because the light emitting direction is on a cathode side, in order to ensure a good light transmittance, the cathode is required to be very thin, therefore, providing the voltage drop with a low voltage of the power line 310 for the cathode has an important effect on improving the uniformity of the display brightness.

As shown in FIG. 4 and FIG. 5, combined with FIG. 6 to FIG. 24, the display substrate of an exemplary embodiment of the present disclosure includes a display region 100 and an edge region 300, wherein the edge region 300 includes a circuit region 301, an isolation dam region 302, a crack dam region 303 and a cutting region 304 which are sequentially disposed along a direction away from the display region 100.

In an exemplary embodiment, the display region 100 of the display substrate includes:
  a substrate 10;
  a first insulating layer 11 disposed on the substrate 10;
  a semiconductor layer disposed on the first insulating layer 11, wherein the semiconductor layer at least includes a first active layer;
  a second insulating layer 12 covering the semiconductor layer;
  a first gate metal layer disposed on the second insulating layer 12, wherein the first gate metal layer at least includes a first gate electrode;
  a third insulating layer 13 and a fourth insulating layer 14 covering the first gate metal layer, on which two first via holes exposing the first active layer are disposed;
  a first source and drain metal layer disposed on the fourth insulating layer 14, wherein the source and drain metal layer at least includes a first source electrode and a first drain electrode, and the first source electrode and the first drain electrode are respectively connected to the first active layer through the first via hole;
  a fifth insulating layer 15 and a first planarization layer 16 covering the first source and drain metal layer, on which a second via hole exposing the first drain electrode is disposed;
  a first connection electrode 106 disposed on the first planarization layer 16, wherein the first connection electrode 106 is connected to the first drain electrode through the second via hole;
  a second planarization layer 17 covering the first connection electrode 106, on which a third via hole exposing the first connection electrode 106 is disposed;
  an anode 21 disposed on the second planarization layer 17, wherein the anode 21 is connected to the first connection electrode 106 through the third via hole;
  a pixel define layer 22 disposed on the anode 21, wherein the pixel define layer 22 is provided with a pixel opening exposing the anode 21;
  an organic light emitting layer 24 disposed in the pixel opening, wherein the organic light emitting layer 24 is connected to the anode 21;
  a cathode 25 disposed on the organic light emitting layer 24 and the pixel define layer 22, wherein the cathode 25 is connected to the organic light emitting layer 24;
  an encapsulation layer 26 covering the above structures, wherein the encapsulation layer 26 has a laminated structure of inorganic material/organic material/inorganic material.

In an exemplary embodiment, the edge region 300 of the display substrate includes:
  a substrate 10;
  a first insulating layer 11 disposed on the substrate 10;
  a semiconductor layer disposed on the first insulating layer 11, wherein the semiconductor layer at least includes a second active layer and a third active layer located at the circuit region 301;
  a second insulating layer 12 covering the semiconductor layer;
  a first gate metal layer disposed on the second insulating layer 12, wherein the first gate metal layer at least includes a second gate electrode, a third gate electrode, a first capacitor electrode and a second capacitor electrode located at the circuit region 310;
  a third insulating layer 13 covering the first gate metal layer;
  a second gate metal layer disposed on the third insulating layer 13, wherein the second gate metal layer at least includes a third capacitor electrode and a fourth capacitor electrode located at the circuit region 301;
  a fourth insulating layer 14 covering the second gate metal layer, wherein a fourth insulating layer 14 of the circuit 310 is provided with a plurality of first via holes exposing the second and the third active layers, a fourth insulating layer 14 of the crack dam region 303 forms a crack dam 31 including a plurality of cracks, and a fourth insulating layer 14 of the cutting region 304 forms a cutting groove 32 including a first groove and a second groove;
  a first source and drain metal layer disposed on the fourth insulating layer 14, wherein the first source and drain metal layer at least including a second source electrode, a second drain electrode, a third source electrode and a third drain electrode located at the circuit region 301, and a power line 310 located at the isolation dam region 302; the second source electrode and the second drain electrode are respectively connected to the second active layer through the first via hole, and the third source electrode and the third drain electrode are respectively connected to the third active layer through the first via hole;
  a fifth insulating layer 15 covering the first source and drain metal layer, wherein a fifth insulating thin film of the crack dam region 303 and the cutting region 304 are removed, and the fifth insulating layer 15 of the isolation dam region 302 covers an edge of the power line 310;

a first planarization layer 16 disposed in the circuit region 301, the crack dam region 303 and the cutting region 304, and a first dam foundation 401 formed in the isolation dam region 302; wherein the first planarization layer 16 of the circuit region 301 is disposed on the fifth insulating layer 15, the first planarization layer 16 of the crack dam region 303 completely fills the crack dam 31, the first planarization layer 16 of the cutting region 304 completely fills the groove 32, and the first dam foundation 401 of the isolation dam region 302 is disposed on the power line 310;

auxiliary power lines 320 disposed in the isolation dam region 302, wherein the auxiliary power lines 320 cover a first surface of the first dam foundation 401 away from the power line 310, a first proximal side adjacent to the display region 100 and a first distal side away from the display region 100; an auxiliary power line 320 located at the first dam foundation 401 adjacent to the display region 100 and an auxiliary power line 320 located at the first dam foundation 401 away from the display region 100 are lapped on the power lines 310; the auxiliary power lines 320 covering the first surface of the first dam foundation 401 are provided with a first deflation structure;

a second planarization layer 17 disposed in the circuit region 301, a second dam foundation 402 and a third dam foundation 403 disposed in the isolation dam region 302, wherein the third dam foundation 403 is disposed on the auxiliary power lines 320 covering the first surface, and the second dam foundation 402 is disposed on the auxiliary power line 320 of the first dam foundation 401 adjacent to the display region 100;

second connection electrodes 107 disposed in the circuit region 301 and the isolation dam region 302, wherein the second connection electrodes 107 of the circuit region 301 are disposed on the second planarization layer 17, and are provided with a plurality of fourth via holes; the second connection electrodes 107 of the isolation dam region 302 covers a second surface of the second dam foundation 402 away from the power line 310, a second proximal side adjacent to the display region 100 and a second distal side away from the display region 100, and covers part of a surface of the third dam foundation 403. The second connection electrodes 107 located at the second dam foundation 402 adjacent to the display region 100 and the second connection electrodes 107 located at the second dam foundation 402 away from the display region 100 are lapped on the auxiliary power line 320, and the second connection electrodes 107 covering the second surface of the second dam foundation 402 are provided with a second deflation structure;

a plurality of post spacers 23 disposed in the circuit region 301, and a fourth dam foundation 404 and a fifth dam foundation 405 disposed in the isolation dam region 302; wherein positions of the plurality of post spacers 23 correspond to positions of the plurality of fourth via holes disposed on the second connection electrodes 107, and the second connection electrodes 107 are exposed between adjacent post spacers 23; the fourth dam foundation 404 is disposed on the second connection electrodes 107 covering the second surface, and the fifth dam foundation 405 is disposed on the third dam foundation 403; the second dam foundation 402, the second connection electrodes 107 covering the second surface and the fourth dam foundation 404 form a first isolation dam 410; the first dam foundation 401, the auxiliary power lines 320 covering the first surface, the third dam foundation 403, and the fifth dam foundation 405 form a second isolation dam 420;

cathodes 25 disposed in the circuit region 301, wherein the cathodes 25 enclose a plurality of post spacers 23, and the cathodes 25 are connected to the second connection electrodes 107 exposed between the plurality of post spacers 23;

encapsulation layers 26 covering the above structures, wherein an encapsulation layer 26 of the circuit region 301 has a laminated structure of inorganic materials/organic materials/inorganic materials, and an encapsulation layer 26 of the isolation dam region 302 has a laminated structure of inorganic materials/inorganic materials.

The following is an exemplary explanation through a preparation process of the display substrate. The "patterning processes" mentioned in the present disclosure includes processes such as coating of photoresist, mask exposure, development, etching and stripping of photoresist for metal materials, inorganic materials or transparent conductive materials, and includes processes such as coating of organic material, mask exposure and development for organic materials. Deposition may be implemented by any one or more of sputtering, evaporation and chemical vapor deposition, coating may be implemented by any one or more of spraying coating, spin coating and ink-jet printing, and etching may be implemented by any one or more of dry etching and wet etching, and these are not limited in the present disclosure. "Thin film" refers to a layer of thin film fabricated by a certain material on a substrate by using deposition, coating or other process. If the "thin film" does not need a patterning process during the whole manufacturing process, the "thin film" may also be called a "layer". If the "thin film" needs a patterning process throughout the whole manufacturing process, it is referred to as a "thin film" before the patterning process and as a "layer" after the patterning process. The "layer" after the patterning process contains at least one "pattern". "A and B are disposed on a same layer" mentioned in the present disclosure refers that A and B are formed at the same time by a same patterning process, and the "thickness" of a film is a dimension of the film in a direction perpendicular to the display substrate. In an exemplary embodiment of the present disclosure, "an orthographic projection of B is within a range of an orthographic projection of A" refers that a boundary of an orthographic projection of B falls within a boundary of an orthographic projection of A, or the boundary of the orthographic projection of A overlaps with the boundary of the orthographic projection of B.

In an exemplary embodiment, the display substrate includes a display region 100 and an edge region 300, and the edge region 300 includes a circuit region 301, an isolation dam region 302, a crack dam region 303, and a cutting region 304 which are sequentially disposed along a direction away from the display region 100. The preparation process of the display substrate may include the following operation procedures:

(1) A substrate 10 is prepared on a glass carrier plate 1. In an exemplary embodiment, the substrate 10 may include a first flexible material layer, a first inorganic material layer, a semiconductor layer, a second flexible material layer and a second inorganic material layer stacked on the glass carrier plate 1. Material of the first flexible material layer and the second flexible material layer may be polyimide (PI), polyethylene terephthalate (PET) or polymer soft film after surface treatment, and material of the first inorganic material layer and the second inorganic material layer may be silicon nitride (SiNx) or silicon oxide (SiOx) to improve the water and oxygen resistance capability of the substrate. The first inorganic material layer and the second inorganic material layers may be called Barrier layers, and amorphous silicon (a-si) may be used as the material of the semiconductor layer. In an exemplary embodiment, taking a laminated structure PI1/Barrier1/a-si/PI2/Barrier 2 as an example, the preparation process may include: coating a layer of polyimide on the glass carrier plate 1, and forming a first flexible (PI1) layer after curing to form a film; subsequently, depositing a layer of barrier film on the first flexible layer to form a first barrier (Barrier 1) layer covering the first flexible layer; then depositing a layer of amorphous silicon film on the first barrier layer to form an amorphous silicon (a-si) layer covering the first barrier layer; then coating a layer of polyimide on the amorphous silicon layer, and forming a second flexible (PI2) layer after curing to form a film; then depositing a layer of barrier film on the second flexible layer to form a second barrier (Barrier 2) layer covering the second flexible layer, to complete the preparation of the substrate 10. After this process, both the display region 100 and the peripheral region 300 include the substrate 10.

(2) Patterns of a drive structure layer and a circuit structure layer are prepared on the substrate 10. A drive structure layer of the display region 100 includes a first transistor 101 in a pixel drive circuit, and a circuit structure layer of the peripheral region 300 includes a second transistor 102, a third transistor 103, a first storage capacitor 104, a second storage capacitor 105 and a power line 310 forming a Gate Driver on Array (GOA) circuit. In an exemplary embodiment, the preparation process of the drive structure layer and the circuit structure layer may include:

sequentially depositing a first insulating thin film and a semiconductor film on the substrate 10, and patterning the semiconductor film by a patterning process to form a first insulating layer 11 covering the whole substrate 10 and a semiconductor layer pattern disposed on the first insulating layer 11, wherein the semiconductor layer pattern at least includes a first active layer located at the display region 100, and a second active layer and a third active layer located at the circuit region 301.

Then sequentially depositing a second insulating thin film and a first metal thin film, and patterning the first metal thin film by a patterning process to form a second insulating layer 12 covering the semiconductor layer pattern and a first gate metal layer pattern disposed on the second insulating layer 12, wherein the first gate metal layer pattern at least includes a first gate electrode located at the display region 100, and a second gate electrode, a third gate electrode, a first capacitor electrode and a second capacitor electrode located at the circuit region 301.

Then, sequentially depositing a third insulating thin film and a second metal thin film, and patterning the second metal thin film by a patterning process to form a third insulating layer 13 covering the first metal gate layer and a second gate metal layer pattern disposed on the third insulating layer 13, wherein the second gate metal layer pattern at least includes a third capacitor electrode and a fourth capacitor electrode located at circuit region 301; wherein a position of the third capacitor electrode corresponds to a position of the first capacitor electrode and a position of the fourth capacitor electrode corresponds to a position of the second capacitor electrode.

Then, depositing a fourth insulating thin film and forming patterns of a plurality of first via holes, crack dams 31 and cutting grooves 32 by a patterning process. Etching away a fourth insulating layer, the third insulating layer 13 and the second insulating layer 12 in two first via holes of the display region 100 to expose both ends of the first active layer. Four first via holes in the circuit region 301 respectively exposes both ends of the second active layer and the third active layer. Forming a crack dam 31 in a crack dam region 303 and the crack dam 31 includes a plurality of cracks disposed at intervals, wherein each crack exposes a surface of the first insulating layer 11. Forming a cutting groove 32 in a cutting region 304, and the cutting groove 32 includes a first groove and a second groove, wherein the first groove exposes the substrate 10 and the second groove exposes the first groove, that is, an orthographic projection of the first groove on the substrate 10 includes an orthographic projection of the second groove on the substrate 10. After this patterning process, the isolation dam region 302 includes a composite insulating layer disposed on the substrate 10, the crack dam region 303 includes a composite insulating layer with a plurality of cracks disposed on the substrate 10, and the cutting region 304 includes a composite insulating layer with grooves disposed on the substrate 10. In an exemplary embodiment, the composite insulating layer includes a first insulating layer 11, a second insulating layer 12, a third insulating layer 13, and a fourth insulating layer 14 stacked on the substrate 10.

In an exemplary embodiment, the cracks, the first groove and the second groove may be formed by two patterning processes. For example, etching away the fourth insulating layer 14, the third insulating layer 13, and the second insulating layer 12 through an Etch Bending A MASK (abbreviated as EBA MASK) to form a second groove in the cutting region 304; forming a plurality of cracks in the crack dam region 303 and forming a plurality of first via holes in the circuit region 301 and the display region 100; etching away the fourth insulating layer 14, the third insulating layer 13 and the second insulating layer 12 in the plurality of cracks and the second groove to expose a surface of the first insulating layer 11; etching away the fourth insulating layer 14, the third insulating layer 13 and the second insulating layer 12 in the plurality of first via holes to respectively expose the both ends of the first active layer, the second active layer and the third active layer. Then etching away the first insulating layer 11 in the second groove in the cutting region 304 through an Etch Bending B MASK (abbreviated as EBB MASK), and forming a first groove on the first insulating layer 11; etching away the first insulating layer in the first groove to expose a surface of the substrate 10. In this way, in the cutting region 304, the second groove exposes the first groove, and the first groove exposes the substrate 10, forming a stepped groove structure. In the crack dam region 303, the plurality of cracks disposed at intervals expose the surface of the first insulating layer 11, forming a crack dam structure in a concave-convex shape. The EBA MASK and EBB MASK processes are patterning processes for trenching a bending region of the bonding region to reduce the thickness of the bending region. In an exemplary embodiment, forming the crack dam structure in the concave-convex shape in the crack dam region 303 is to avoid affecting film layer structures of the display region 100 and the circuit region 301 during the cutting process. The plurality of cracks disposed at intervals may not only reduce a stress on the display region 100 and the circuit region 301, but also may cut off transmission of cracks in a direction towards the display region 100 and the circuit region 301. In an exemplary embodiment, part of a thickness of a second barrier layer in the substrate 10 may be etched away in the first groove.

Then, depositing a third metal thin film, patterning the third metal thin film by a patterning process, and forming a pattern of a first source and drain metal layer on the fourth insulating layer 14, wherein, the pattern of the first source and drain metal layer at least includes a first source electrode and a first drain electrode formed in the display region 100, a second source electrode, a second drain electrode, a third source electrode and a third drain electrode formed in the circuit region 301, and power line 302 formed in the isolation dam region 302. The first source electrode and the first drain electrode are respectively connected to the first active layer through the first via holes, the second source electrode and the second drain electrode are respectively connected to the second active layer through the first via holes, and the third source electrode and the third drain electrode are respectively connected to the third active layer through the first via holes. The power line 310 formed in the isolation dam region 302 is disposed on the fourth insulating layer 14, and an end of the power line 310 away from the display region 100 is spaced from the crack dam 31. In an exemplary embodiment, a thickness of the first source and drain metal layer may be about 700 nm to 1000 nm. In some possible implementations, the thickness of the first source and drain metal layer may be about 860 nm.

Figure 6:
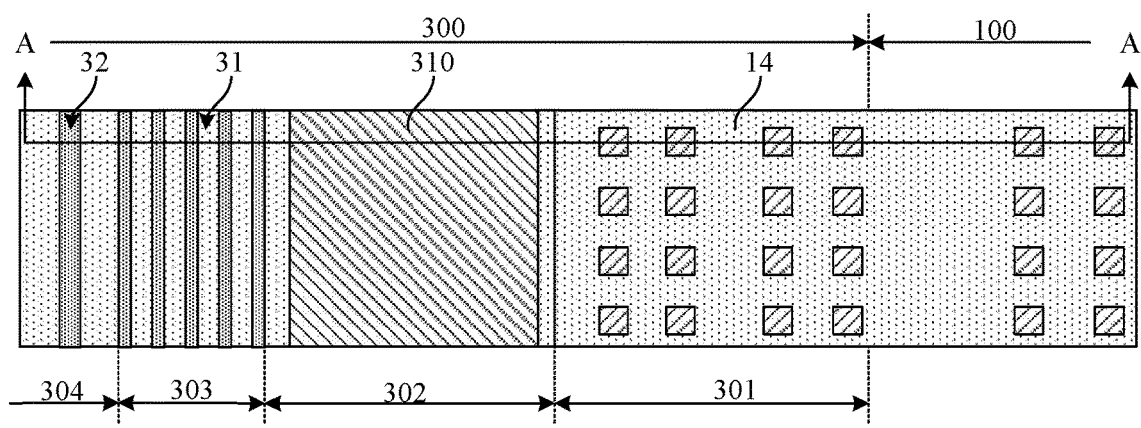
FIG. 6 is a schematic diagram after patterns of a drive structure layer and a circuit structure layer are formed according to the present disclosure.
Figure 7:
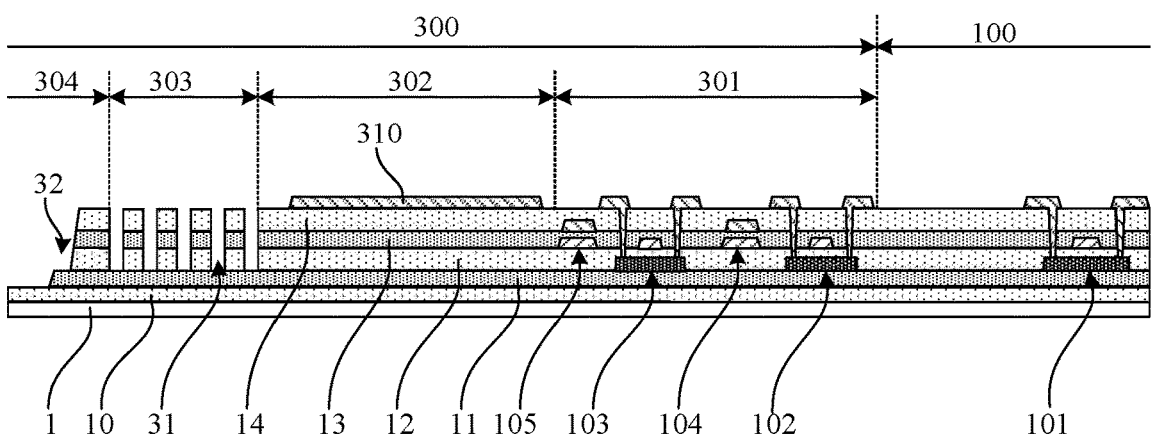
FIG. 7 is a sectional view taken along an A-A direction in FIG. 6.

At this point, preparing the patterns of the drive structure layer and the circuit structure layer on the substrate 10, as shown in FIGS. 6 and 7, and FIG. 7 is a sectional view taken along an A-A direction in FIG. 6. In an exemplary embodiment, the first active layer, the first gate electrode, the first source electrode and the first drain electrode form a first transistor 101, the second active layer, the second gate electrode, the second source electrode and the second drain electrode form a second transistor 102, the third active layer, the third gate electrode, the third source electrode and the third drain electrode form a third transistor 103, the first capacitor electrode and the third capacitor electrode form a first storage capacitor 104, and the second capacitor electrode and the fourth capacitor electrode form a second storage capacitor 104. In an exemplary embodiment, the first transistor 101 may be a driving transistor in a pixel drive circuit, the second transistor 102 may be a scanning transistor for outputting a scan signal in a GOA circuit, the third transistor 103 may be an enabling transistor for outputting an enable (EM) signal in a GOA circuit, wherein the driving transistor, the scanning transistor and the enabling transistor may be a thin film transistor (abbreviated as TFT).

Figure 8:
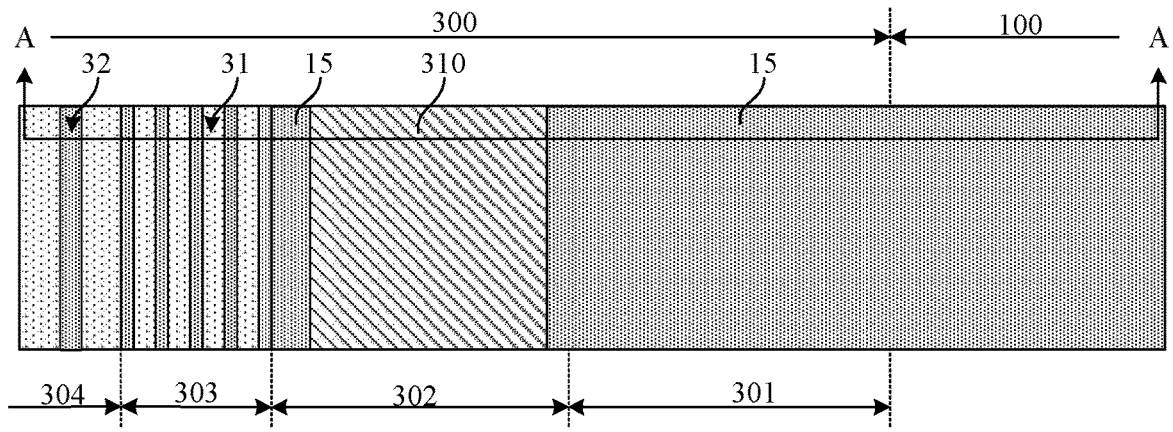
FIG. 8 is a schematic diagram after a pattern of a fifth insulating layer is formed according to the present disclosure.
Figure 9:
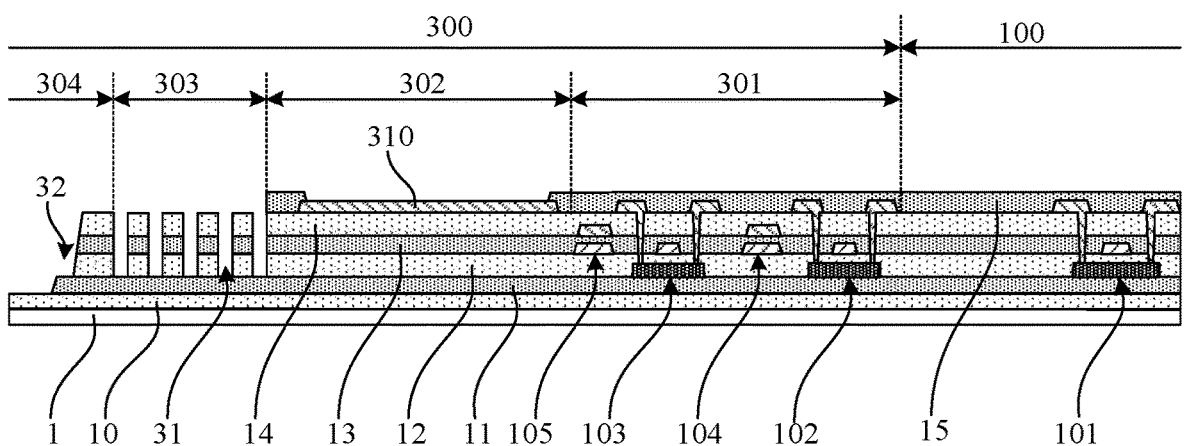
FIG. 9 is a sectional view taken along an A-A direction in FIG. 8.

(3) A fifth insulating thin film is deposited on the substrate where the above patterns are formed, and the fifth insulating thin film is patterned by a patterning process, a pattern of a fifth insulating layer 15 is formed in the display region 100, the circuit region 301 and the isolation dam region 302, and the fifth insulating thin film in the crack dam region 303 and the cutting region 304 is removed. The fifth insulating layer 15 of the display region 100 and the circuit region 301 covers the source and drain electrodes of the first transistor 101, the second transistor 102 and the third transistor 103, and the fifth insulating layer 15 of the isolation dam region 302 only covers an edge of the power line 310, that is, a first edge of the power line 310 adjacent to the display region 100 and a second edge of the power line 310 away from the display region 100 are covered by the fifth insulating layer 15, and the fifth insulating layer 15 between the first edge and the second edge is removed to expose a surface of the power line 310, as shown in FIG. 8 and FIG. 9, and FIG. 9 is a cross-sectional view taken along the line A-A in FIG. 8.

Figure 10:
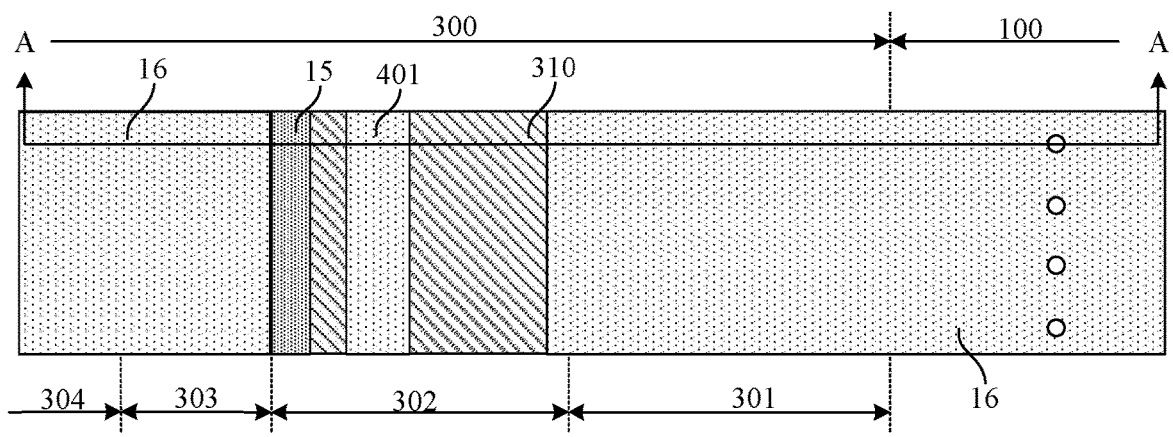
FIG. 10 is a schematic diagram of a structure after a pattern of a first planarization layer is formed according to the present disclosure.
Figure 11:
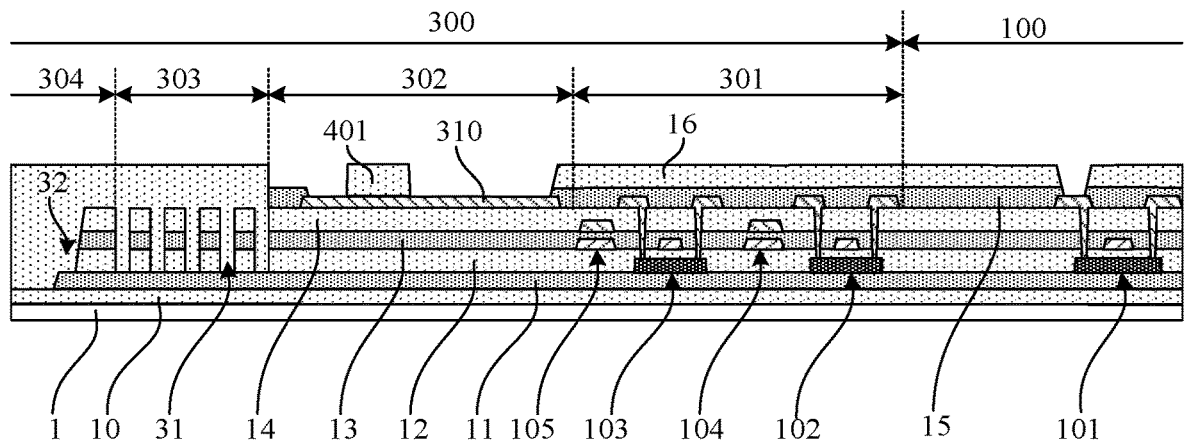
FIG. 11 is a sectional view taken along an A-A direction in FIG. 10.

(4) A first planarization film is coated on the substrate where the above patterns are formed, the first planarization film is patterned by a patterning process, a first planarization (PLN) layer 16 is formed on the display region 100, the circuit region 301, the crack dam region 303 and the cutting region 304, and patterns of a second via hole, a partition and a planarization dam foundation are formed on the first planarization layer 16. The second via hole is formed in the display region 100, and the first planarization layer 16 and the fifth insulating layer 15 in the second via hole is removed to expose a surface of the first drain electrode of the first transistor 101. The partition is formed in the isolation dam region 302, and the first planarization layer 16 in the partition is removed to expose the surface of the power line 310. A first dam foundation 401 is formed on the power line 310 in the partition. The first planarization layer 16 formed in the crack dam region 303 completely fills cracks in the crack dam 31, and the first planarization layer 16 formed in the cutting region 304 completely fills a groove 32, as shown in FIGS. 10 and 11, and FIG. 11 is a sectional view taken along an A-A direction in FIG. 10. In an exemplary embodiment, a first length of the first dam foundation 401 may be about 20 µm to 60 µm, and the first dam foundation 401 is configured to form a second isolation dam. In the present disclosure, "a first length" refers to a feature size along a direction away from the display region.

Figure 12:
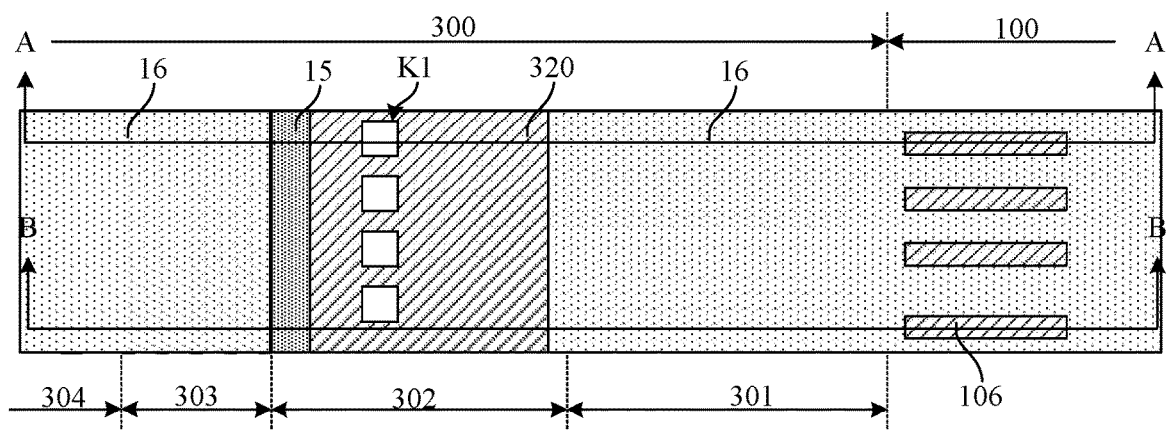
FIG. 12 is a schematic diagram after a pattern of a second source and drain metal layer is formed according to the present disclosure.
Figure 13:
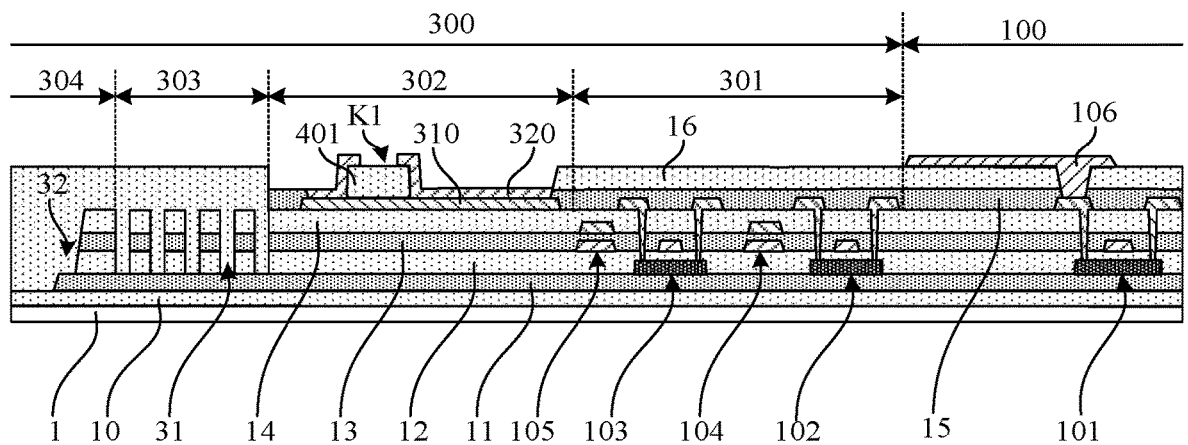
FIG. 13 is a sectional view taken along an A-A direction in FIG. 12.
Figure 14:
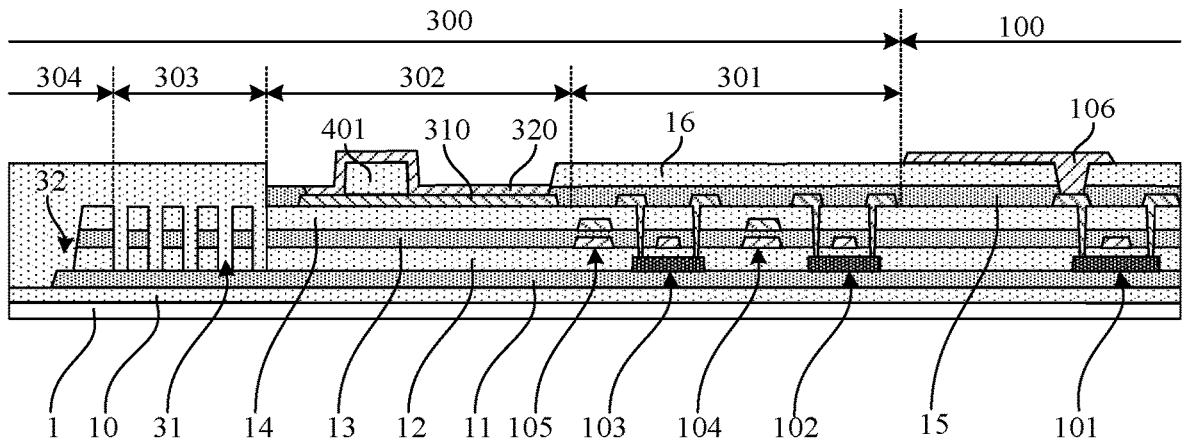
FIG. 14 is a sectional view taken along a B-B direction in FIG. 12.

(5) A fourth metal thin film is deposited on the substrate where the above patterns are formed, and the fourth metal thin film is patterned by a patterning process to form a second source and drain metal layer pattern, wherein the second source and drain metal layer pattern at least includes a first connection electrode 106 and an auxiliary power line 320. The first connection electrode 106 is formed in the display region 100 and connected to the first drain electrode of the first transistor 101 through the second via hole. The auxiliary power line 320 is formed in the isolation dam region 302, covering a surface of the first dam foundation 401. A first side of the auxiliary power line 320 adjacent to the display region 100 and a second side away from the display region 100 are lapped with the power line 310, that is, the auxiliary power line 320 is disposed on the power lines 310 exposed on both sides of the first dam foundation 401 to achieve the connection between the power line 310 and the auxiliary power line 320. The auxiliary power line 320 is provided with first deflation structure K1, as shown in FIG. 12, FIG. 13 and FIG. 14. FIG. 13 is a sectional view taken along an A-A direction in FIG. 12, and FIG. 14 is a sectional view taken along B-B in FIG. 12. In an exemplary embodiment, the first dam foundation 401 includes a first surface (an upper surface) away from the power line 310, a first proximal side (a right side surface) adjacent to the display region 100, and a first distal side (a left side surface) away from the display region 100. The first deflation structure K1 is disposed on the auxiliary power line 320 covering a first surface of the first dam foundation 401, and an orthographic projection of the first deflation structure K1 on the substrate is located within a scope of an orthographic projection of the first surface on the substrate. In an exemplary embodiment, the first deflation structure K1 may be at least one first through hole, and the auxiliary power line 320 in the at least one first through hole is removed to expose the first surface of the first dam foundation 401. In this way, the power line 310 of the first source and drain metal layer and the auxiliary power line 320 of the second source and drain metal layer form a double-layer power line in an edge region 300. By lapping in the isolation dam region 302, a double-layer power wiring with a parallel structure is achieved, which reduces a resistance of a power wiring in the edge region, minimizes voltage drop of voltage signals, and improves display brightness uniformity of the display region, and thereby improving display quality. In an exemplary embodiment, a plurality of first through holes may be disposed at intervals along an edge direction of the display region, and in a section parallel to the display substrate, a shape of the first through hole may be a triangle, a rectangle, a polygon, a circle, an ellipse, etc. In an exemplary embodiment, a shape of the first through hole may be a rectangular, a first length of the rectangle may be about 10 μm to 40 μm, a second length of the rectangle may be about 10 μm to 40 μm, and a distance between adjacent first through holes may be about 10 μm to 40 μm. In the present disclosure, "a second length" refers to a feature size along an edge direction of the display region.

In an exemplary embodiment, in a direction perpendicular to the display substrate, a cross-sectional shape of the first dam foundation 401 may be trapezoidal, a first length of an upper bottom (the first surface) away from the substrate may be smaller than a first length of a lower bottom adjacent to the substrate, and the first length of the upper bottom (the first surface) may be about 20 μm to 40 μm. In an exemplary embodiment, a shape of the first through hole may be a first strip extending in a direction away from the display region, a first length of the first strip may be about 80% to 100% of the first length of the upper bottom (the first surface) of the first dam foundation, a second length of the first strip may be about 20% to 60% of the first length of the first strip, and a distance between adjacent first strips may be about 20% to 60% of the first length of the first strip. In an exemplary embodiment, the first length of the first strip may be about 20 μm to 40 μm, the second length of the first strip may be about 10 μm to 20 μm, and the distance between adjacent first strips may be about 10 μm to 20 μm.

In an exemplary embodiment, the first dam foundation 401 includes a first surface, a first proximal side and a first distal side. The auxiliary power line 320 covering the surface of the first dam foundation 401 may refer that the auxiliary power line 320 completely covers the first proximal side and the first distal side of the first dam foundation 401 and partially covers the first surface of the first dam foundation 401, as shown in FIG. 13. Partially covering the first surface of the first dam foundation 401 refers that the auxiliary power line 320 covers part of the first surface (a first proximal region) adjacent to the display region 100 and part of the first surface (a first distal region) away from the display region 100, and a region between the first proximal region and the first distal region is where the first through hole is located, exposing the first surface of the first dam foundation 401. In an exemplary embodiment, the auxiliary power line 320 covering the surface of the first dam foundation 401 may refer that the auxiliary power line 320 merely completely covers the first proximal side and the first distal side of the first dam foundation 401, that is the first surface of the first dam foundation 401 is where the first through hole is located.

In an exemplary embodiment, the first dam foundation 401 includes a first surface, a first proximal side and a first distal side. The auxiliary power line 320 covering the surface of the first dam foundation 401 may refer that the auxiliary power line 320 completely covers the first surface, the first proximal side and the first distal side of the first dam foundation 401, that is, the auxiliary power line 320 encloses the first surface, the first proximal side and the first distal side of the first dam foundation 401, as shown in FIG. 14.

In an exemplary embodiment, the first deflation structure K1 disposed on the auxiliary power line 320 is configured to form a deflation channel, which discharges gases generated by a planarization film during the process, thereby avoiding peeling of a film and improving the process quality. In an exemplary embodiment, a thickness of the second source and drain metal layer may be about 700 nm to 1000 nm. In some possible implementations, the thickness of the second source and drain metal layer may be about 860 nm.

Figure 15:
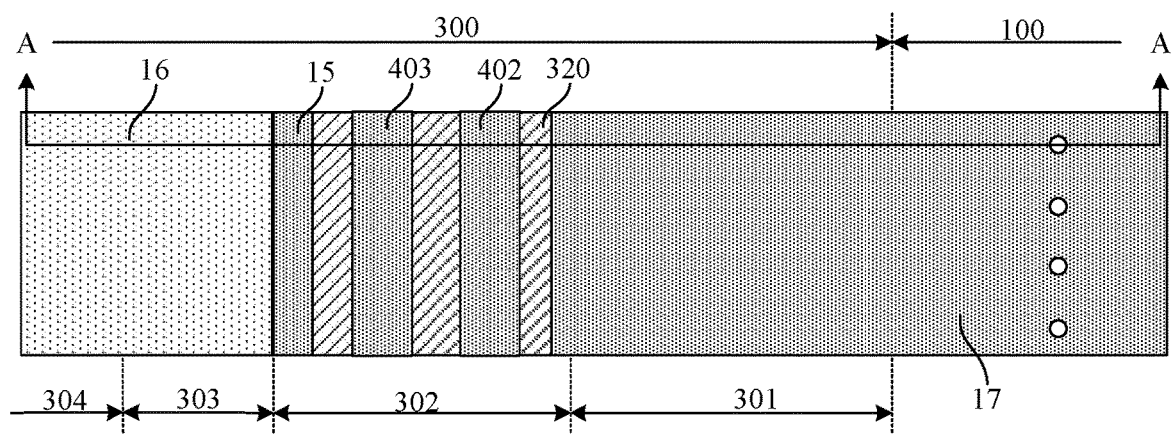
FIG. 15 is a schematic structural diagram after a pattern of a second planarization layer is formed according to the present disclosure.
Figure 16:
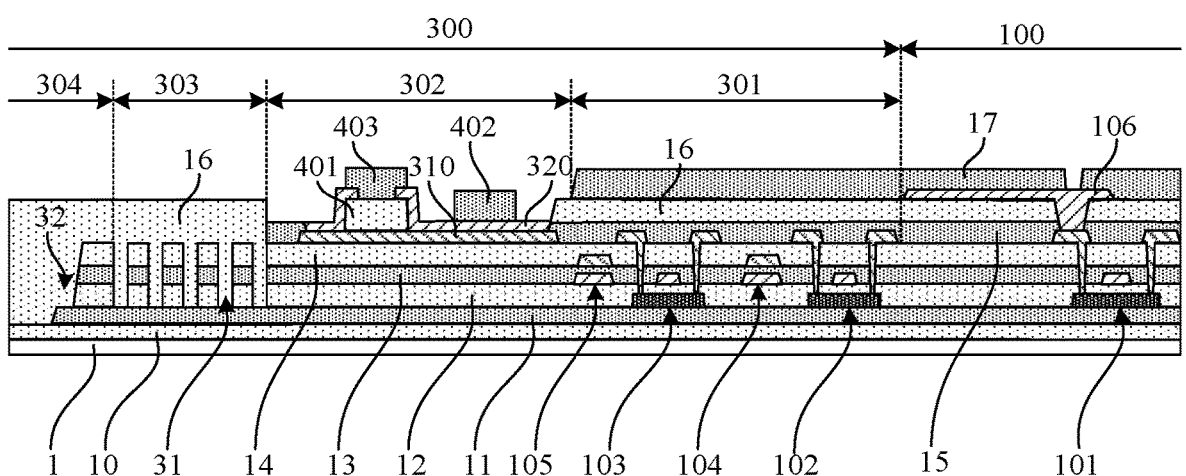
FIG. 16 is a sectional view taken along an A-A direction in FIG. 15.

(6) A second planarization thin film is coated on the substrate where the above patterns are formed, and the second planarization thin film is patterned by a patterning process to form patterns of a second planarization layer 17, a second dam foundation 402 and a third dam foundation 403. The second planarization layer 17 is formed in the display region 100 and the circuit region 301, on which a third via hole is disposed, and the second planarization layer 17 in the third via hole is developed to expose a surface of the first connection electrode 106. The second dam foundation 402 and the third dam foundation 403 are formed in the isolation dam region 302, the third dam foundation 403 is disposed on the auxiliary power line 320 covering the first surface of the first dam foundation 401, and the second dam foundation 402 is disposed on the auxiliary power line 320 on the first dam foundation 401 adjacent to the display region 100. A distance between the second dam foundation 402 and the display region 100 is smaller than that between the first dam foundation 401 and the display region 100. A side of the second dam foundation 402 adjacent to the third dam foundation 403 and a side of the second dam foundation 402 away from the third dam foundation 403 both expose the auxiliary power line 320, as shown in FIGS. 15 and 16, and FIG. 16 is a cross-sectional view taken along an A-A direction in FIG. 15. In an exemplary embodiment, a first length of the second dam foundation 402 may be about 20 μm to 60 μm, and a first length of the third dam foundation 403 may be about 20 μm to 60 μm. An orthographic projection of the first dam foundation 401 on the substrate includes an orthographic projection of the third dam foundation 403 on the substrate, and the second dam foundation 402 and the third dam foundation 403 are configured to form two isolation dams.

Figure 17:
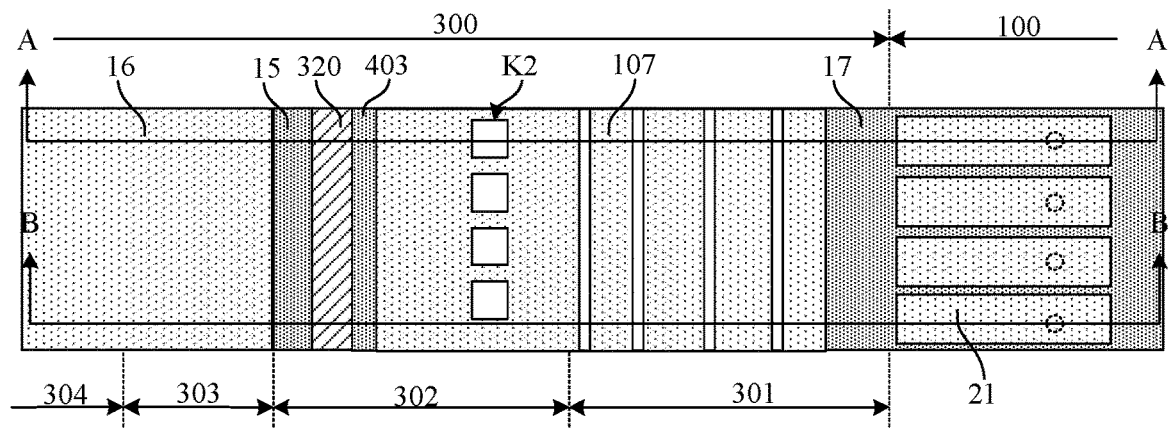
FIG. 17 is a schematic structural diagram after patterns of an anode and a second connection electrode are formed according to the present disclosure.
Figure 18:
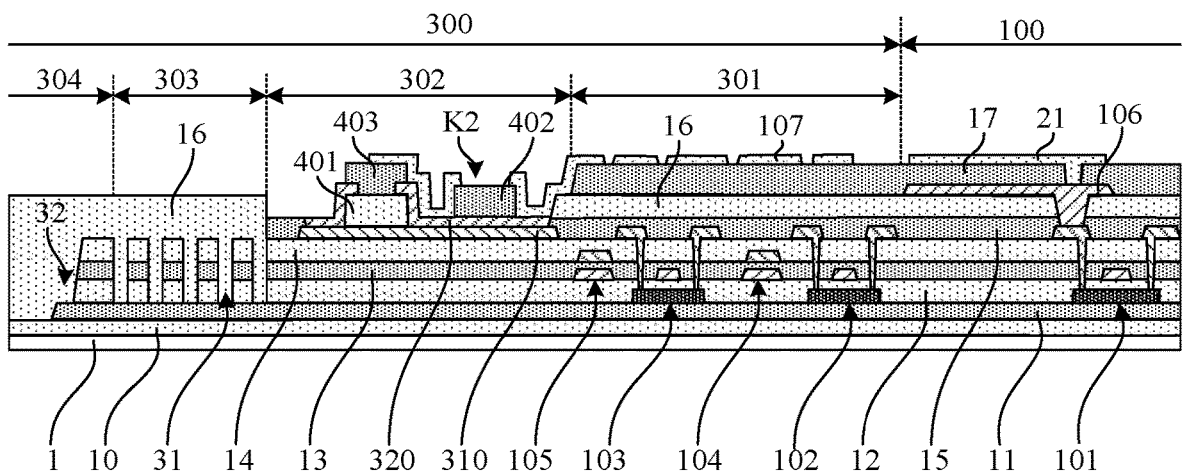
FIG. 18 is a sectional view taken along an A-A direction in FIG. 17.
Figure 19:
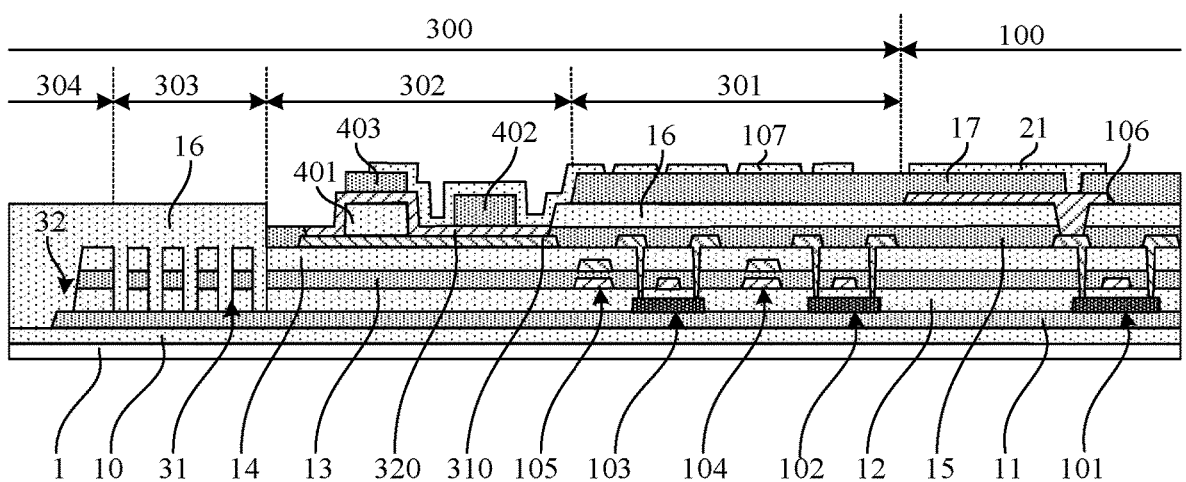
FIG. 19 is a sectional view taken along a B-B direction in FIG. 17.

(7) A transparent conductive thin film is deposited on the substrate where the above patterns are formed, and the transparent conductive thin film is patterned by a patterning process to form patterns of an anode 21 and a second connection electrode 107. The anode 21 is disposed on the second planarization layer 17 of the display region 100, wherein the anode 21 is connected to the first connection electrode 106 through the third via hole. Second connection electrodes 107 are formed in the circuit region 301 and the isolation dam region 302. Part of the second connection electrodes 107 is disposed on the second planarization layer 17 of the circuit region 301, which is disposed with a plurality of fourth via holes, and the other part of the second connection electrodes 107 is disposed in the isolation dam region 302. The second connection electrode 107 covers the second dam foundation 402, partially covers the third dam foundation 403, and covers surfaces of the auxiliary power lines 320 exposed on both sides of the second dam foundation 402. The second connection electrode 107 is provided with second deflation structures K2, as shown in FIGS. 17, 18 and 19, in which FIG. 18 is a sectional view taken along an A-A direction in FIG. 17 and FIG. 19 is a sectional view taken along B-B in FIG. 17. In an exemplary embodiment, the second dam foundation 402 includes a second surface (an upper surface) away from the power line 310, a second proximal side (a right side surface) adjacent to the display region 100, and a second distal side (a left side surface) away from the display region 100. The second deflation structure K2 is disposed on the second connection electrode 107 covering a second surface of the second dam foundation 402, and an orthographic projection of the second deflation structure K2 on the substrate is located within a scope of an orthographic projection of the second surface on the substrate. In an exemplary embodiment, the second deflation structure K2 may be at least one second through hole, and the second connection electrode 107 in the at least one second through hole is removed to expose the second surface of the second dam foundation 402. Since the second connection electrode 107 is connected to the auxiliary power line 320 and the auxiliary power line 320 is connected to the power line 310, a connection between the second connection electrode 107 and the power line 310 is achieved. In an exemplary embodiment, plurality of second through holes may be disposed at intervals along an edge direction of the display region, and in a section parallel to the display substrate, a shape of the second through hole may be a triangle, a rectangle, a polygon, a circle, an ellipse, etc. In an exemplary embodiment, a shape of the second through hole may be a rectangular, a first length of the rectangle may be about 10 μm to 40 μm, a second length of the rectangle may be about 10 μm to 40 μm, and a distance between adjacent second through holes may be about 10 μm to 40 μm.

In an exemplary embodiment, in a direction perpendicular to the display substrate, a cross-sectional shape of the second dam foundation 402 may be trapezoidal, a first length of an upper bottom (the second surface) away from the substrate may be smaller than a first length of a lower bottom adjacent to the substrate, and the first length of the upper bottom (the second surface) may be about 20 μm to 40 μm. In an exemplary embodiment, a shape of the second through hole may be a second strip extending in a direction away from the display region, a first length of the second strip may be about 80% to 100% of the first length of the upper bottom (the second surface) of the second dam foundation, a second length of the second strip may be about 20% to 60% of the first length of the second strip, and a distance between adjacent second strips may be about 20% to 60% of the first length of the second strip. In an exemplary embodiment, the first length of the second strip may be about 20 μm to 40 μm, the second length of the second strip may be about 10 μm to 20 μm, and the distance between adjacent second through holes may be about 10 μm to 20 μm.

In an exemplary embodiment, the second dam foundation 402 includes a second surface, a second proximal side and a second distal side. The second connection electrode 107 covering the surface of the first dam foundation 402 may refer that the second connection electrode 107 completely covers the second proximal side and the second distal side of the second dam foundation 402 and partially covers the second surface of the second dam foundation 402, as shown in FIG. 18. Partially covering the second surface of the second dam foundation 402 refers that the second connection electrode line 107 covers part of the second surface (a second proximal region) adjacent to the display region 100 and part of the second surface (a second distal region) away from the display region 100, and a region between the second proximal region and the second distal region is where the second through hole is located, exposing the second surface of the second dam foundation 402. In an exemplary embodiment, the second connection electrode 107 covering the surface of the second dam foundation 402 may refer that the second connection electrode 107 merely completely covers the second proximal side and the second distal side of the second dam foundation 402, that is the second surface of the second dam foundation 402 is where the second through hole is located.

In an exemplary embodiment, the second dam foundation 402 includes a second surface, a second proximal side and a second distal side. The second connection electrode 107 covering the surface of the second dam foundation 402 may refer that the second connection electrode 107 completely covers the second surface, the second proximal side and the second distal side of the second dam foundation 402, that is the second connection electrode 107 encloses the second surface, the second proximal side and the second distal side of the second dam foundation 402 as shown in FIG. 19.

In an exemplary embodiment, the second deflation structure K2 disposed on the second connection electrode 107 is configured to form a deflation channel, which discharges gases generated by a planarization film during the process, thereby avoiding peeling of a film and improving the process quality.

Figure 20:
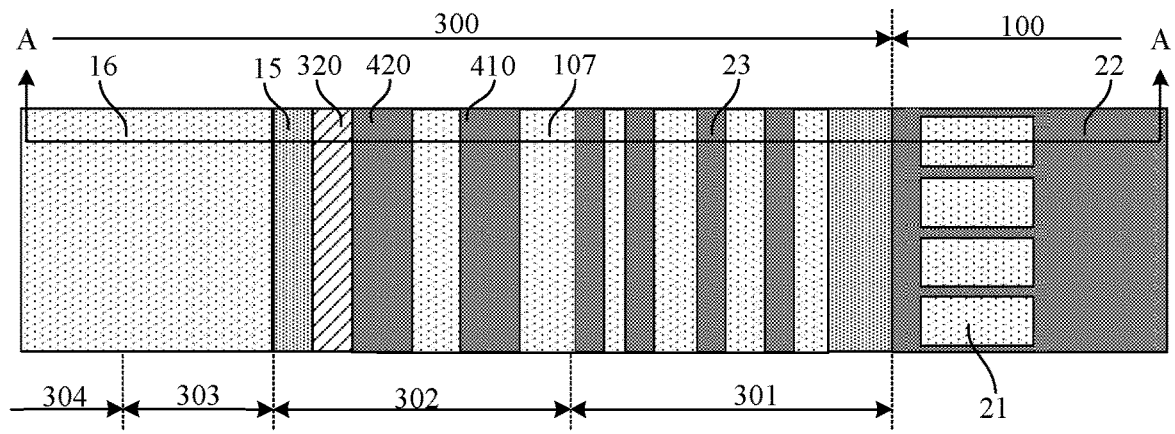
FIG. 20 is a schematic diagram after patterns of a pixel define layer and a post spacer are formed according to the present disclosure.
Figure 21:
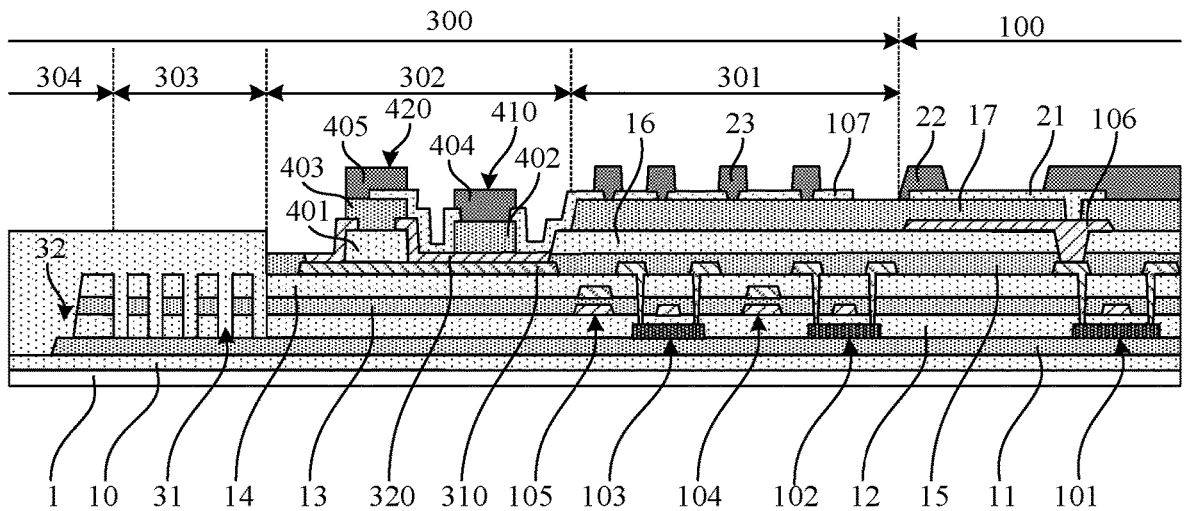
FIG. 21 is a sectional view taken along an A-A direction in FIG. 20.

(8) A pixel define thin film is coated on the substrate where the above patterns are formed, and the pixel define thin film is patterned by a patterning process to form a pixel define layer (PDL) 22, an post spacer (PS) 23, a fourth dam foundation 404 and a fifth dam foundation 405. The pixel define layer 22 is formed in the display region 100, and pixel openings are provided on it. The pixel define thin film in the pixel opening is developed to expose a surface of the anode 21. A plurality of post spacers (PS) 23 are formed in the circuit region 301, wherein positions of the plurality of post spacers 23 correspond to positions of the plurality of fourth via holes disposed on the second connection electrodes 107, and the second connection electrodes 107 are exposed between adjacent post spacers 23. The fourth dam foundation 404 and the fifth dam foundation 405 are formed in the isolation dam region 302, the fourth dam foundation 404 is disposed on the second connection electrodes 107 covering the second surface of the second dam foundation 402, and the fifth dam foundation 405 is disposed on the third dam foundation 403; the second dam foundation 402, the second connection electrodes 107 covering the second surface and the fourth dam foundation 404 form a first isolation dam 410; the first dam foundation 401, the auxiliary power lines 320 covering the first surface, the third dam foundation 403, and the fifth dam foundation 405 form a second isolation dam 420, as shown in FIGS. 20 and 21, and FIG. 21 is a cross-sectional view taken along an A-A direction in FIG. 20.

In an exemplary embodiment, a distance between the first isolation dam 410 and the display region 100 is smaller than that between the second isolation dam 420 and the display region 100. A first length of the fourth dam foundation 404 and a first length of the fifth dam foundation 405 may be about 20 μm to 60 μm. An orthographic projection of the second dam foundation 402 on the substrate includes an orthographic projection of the fourth dam foundation 404 on the substrate. An orthographic projection of the third dam foundation 403 on the base includes the orthographic projection of the fifth dam foundation 405 on the base. A first length of orthographic projections of the first isolation dam 410 and the second isolation dam 420 on the substrate 10 may be about 20 μm to 60 μm, and a distance between the first isolation dam 410 and the second isolation dam 420 may be about 20 μm to 60 μm. In an exemplary embodiment, in a direction perpendicular to the display substrate, cross-sectional shapes of the first isolation dam 410 and the second isolation dam 420 may be trapezoidal.

Figure 22:
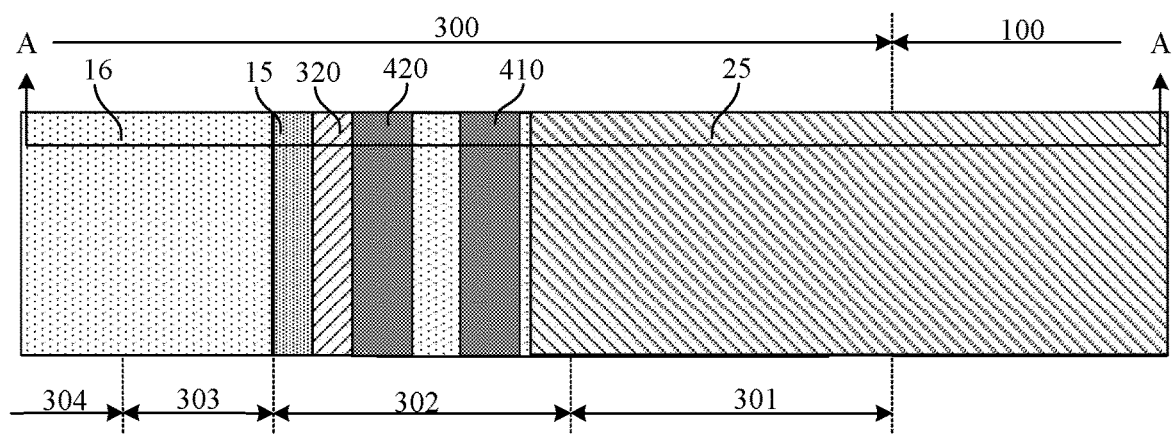
FIG. 22 is a schematic structural diagram after patterns of an organic light emitting layer and a cathode are formed according to the present disclosure.
Figure 23:
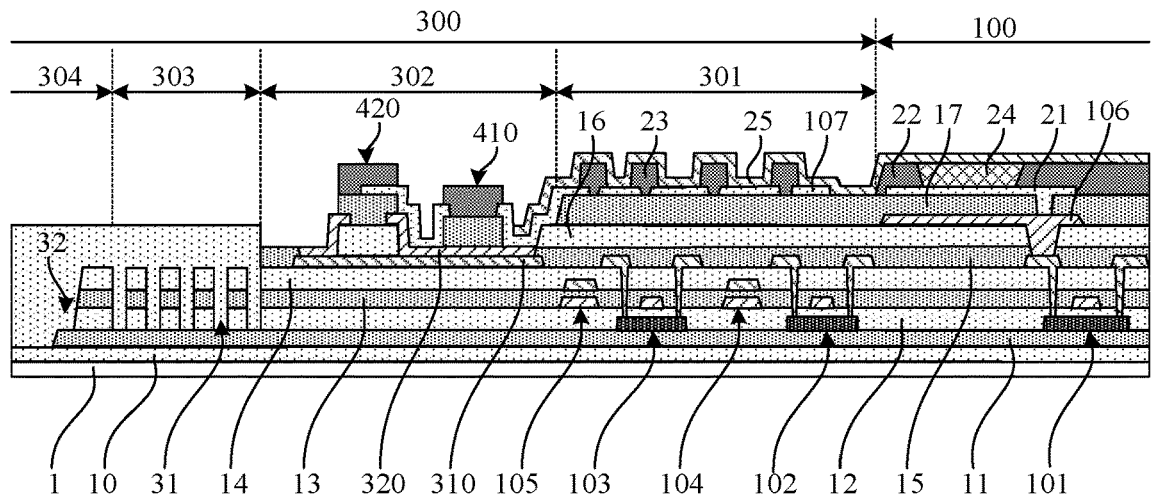
FIG. 23 is a sectional view taken along an A-A direction in FIG. 22.

(9) An organic light emitting layer 24 and a cathode 25 are sequentially formed on the substrate where the above patterns are formed, and the organic light emitting layer 24 is formed in the pixel opening of the display region 100 to achieve a connection between the organic light emitting layer 24 and the anode 21. Since the anode 21 is connected to the first connection electrode 106 and the first connection electrode 106 is connected to a drain electrode of the first transistor 101, a connection between the organic light emitting layer 24 and the drain electrode of the first transistor 101 is achieved. Part of the cathode 25 is formed on the organic light emitting layer 24 of the display region 100, and the cathode 25 is connected to the organic light emitting layer 24, and the other part of the cathode 25 is formed in the circuit region 301. The cathode 25 encloses a plurality of post spacers 23, and is connected to the second connection electrode 107 exposed between a plurality of post spacers 23, as shown in FIGS. 22 and 23, and FIG. 23 is a sectional view taken along an A-A direction A-A in FIG. 22. Since the cathode 25 is connected to the second connection electrode 107, the second connection electrode 107 is connected to the auxiliary power line 320, and the auxiliary power line 320 is connected to the power line 310, the connection between the cathode 25 and the power line 310 is achieved. In an exemplary embodiment, the organic light emitting layer 24 may include a hole injection layer, a hole transport layer, a light emitting layer, an electron transport layer and an electron injection layer which are stacked, and a cathode may be made of any one or more of magnesium (Mg), silver (Ag), aluminum (Al), copper (Cu) and lithium (Li), or an alloy made of any one or more of the above metals.

(10) An encapsulation layer 26 is formed on the basis of forming the above patterns, and the encapsulation layer 26 is formed in the display region 100, the circuit region 301 and the isolation dam region 302. The encapsulation layer 26 of the display region 100 and the circuit region 301 has a laminated structure of a first encapsulation layer, a second encapsulation layer and a third encapsulation layer. The first encapsulation layer is made of an inorganic material, covering the cathode 24 in the display region 100, enclosing the plurality of post spacers 23 in the circuit region 301, and enclosing the first isolation dam 410 and the second isolation dam 420 in the isolation dam region 302. The second encapsulation layer is made of an organic material, and is disposed in the display region 100 and the circuit region 301. The third encapsulation layer is made of an inorganic material, covering the second encapsulation layer of the display region 100 and the circuit region 301, and the first encapsulation layer covering the isolation dam region 302. That is, the encapsulation layer 26 of the display region 100 and the circuit region 301 has a laminated structure of inorganic materials/organic materials/inorganic materials, the organic material layer is disposed between the two inorganic material layers, and the encapsulation layer 26 of the isolation dam region 302 has a laminated structure of inorganic materials/inorganic materials. In an exemplary embodiment, since a region of the isolation dam region 302 adjacent to the crack dam region 303 exposes a surface of the fifth insulating layer 15, two inorganic material layers of the isolation dam region 302 are directly formed on the fifth insulating layer 15, ensuring a encapsulation effect and process quality. In an exemplary embodiment, a preparation process of the display substrate may further include peeling the display substrate from the glass carrier plate 1 by a peeling process, attaching a back film to a back surface of the display substrate (surface of a side the substrate 10 away from the film layer) by a roller binding mode, cutting along a cutting groove by a cutting device, and the like, and the formed display substrate is shown in FIGS. 4 and 5.

In an exemplary embodiment, the first insulating layer, the second insulating layer, the third insulating layer and the fourth insulating layer may be any one or more of silicon oxide (SiOx), silicon nitride (SiNx) and silicon oxynitride (SiON), and may be a single layer, a plurality of layers or a composite layer. The first insulating layer is called a Buffer layer to improve a water and oxygen resistance capability of the substrate, the second insulating layer and third insulating layer are called gate insulating (GI) layers, the fourth insulating layer is called an interlayer dielectric (ILD) layer, and the fifth insulating layer is called a passivation (PVX) layer. The first metal thin film, the second metal thin film, the third metal thin film and the fourth metal thin film may be made of metal materials, such as any one or more of silver (Ag), copper (Cu), aluminum (Al), titanium (Ti) and molybdenum (Mo), or alloy materials of the above metals, such as AlNd alloy or MoNb alloy, which may be a single-layer structure or a multilayer composite structure, such as Ti/Al/Ti, etc. The transparent conductive thin film may include indium tin oxide (ITO) or indium zinc oxide (IZO). Polyimide, acrylic, polyethylene terephthalate or the like may be used for the pixel define layer. The active layer thin film may use various materials such as amorphous indium gallium zinc Oxide (a-IGZO), zinc oxynitride (ZnON), indium zinc tin oxide (IZTO), amorphous silicon (a-Si), polysilicon (p-Si), hexathiophene, polythiophene, or the like, that is, in the present disclosure transistors manufactured based on an Oxide technology, a silicon technology and an organic technology are applicable.

According to the exemplary embodiment of the present disclosure, a power line 310 is formed by a first source and drain metal layer, an auxiliary power line 320 is formed by a second source and drain metal layer, and a double-layer power line is formed in an edge region 300. A double-layer power wiring in a parallel structure is achieved, a resistance of power wiring in the edge region 300 is reduced, voltage drop of voltage signals is minimized to the maximum extent, and display brightness uniformity in the display region and display quality are improved through a connection structure that the auxiliary power line 320 laps with the power line 310 across the second isolation dam. According to the exemplary embodiment of the present disclosure, a first deflation structure and a second deflation structure are respectively disposed on the auxiliary power line 320 and the second connection electrode 107, and the first and second deflation structures form a deflation channel, so that gases generated by a planarization layer may be effectively discharged in the process, thereby avoiding peeling of a film layer and improving process quality. The preparation process of the display substrate in the exemplary embodiment of the present disclosure has good process compatibility, simple process achievement, easy implementation, high production efficiency, low production cost and high yield rate.

Referring to FIGS. 4 to 23, the display substrate according to the exemplary embodiment of the present disclosure includes a display region 100 and an edge region 300. In an exemplary embodiment, the display region 100 includes a drive structure layer disposed on the substrate 10, a light emitting structure layer disposed on the drive structure layer, and an encapsulation layer disposed on the light emitting structure layer. The drive structure layer at least includes a first transistor 101 forming a pixel drive circuit, and the light emitting structure layer at least includes an anode 21, an organic light emitting layer 24 and a cathode 25.

In an exemplary embodiment, the edge region 300 includes a circuit region 301, an isolation dam region 302, a crack dam region 303, and a cutting region 304. In an exemplary embodiment, the circuit region 301 includes a circuit structure layer disposed on the substrate 10, a circuit connection layer disposed on the circuit structure layer, and an encapsulation layer disposed on the circuit connection layer. The circuit structure layer at least includes a second transistor 102, a third transistor 103, a first storage capacitor 104 and a second storage capacitor 105 forming a GOA circuit, and the circuit connection layer at least includes a second connection electrode 107 for connecting the power line 310 to the cathode 25.

In an exemplary embodiment, the isolation dam region 302 includes a composite insulation layer disposed on the substrate 10, a power line 310, an auxiliary power line 320, a second connection electrode 107, a first isolation dam 410, a second isolation dam 420 disposed on the composite insulation layer and an encapsulation layer enclosing the first isolation dam 410 and the second isolation dam 420. A first side of the auxiliary power line 320 adjacent to the display region 100 and a second side of the auxiliary power line 320 away from the display region 100 are lapped on the power line 310. The auxiliary power line 320 between the first side and the second side is disposed in the second isolation dam 420, and the second connection electrode 107 is disposed in the first isolation dam 410 and lapped with the auxiliary power lines 320 exposed on both sides of the first isolation dam 410.

In an exemplary embodiment, the crack dam region 303 includes a composite insulating layer disposed on the substrate 10, the composite insulating layer is formed with a crack dam 31, and a first planarization layer 16 covers and fills the crack dam 31.

In an exemplary embodiment, the cutting region 304 includes a composite insulating layer disposed on the substrate 10, the composite insulating layer is formed with a cutting groove 32, and the first planarization layer 16 covers and fills the cutting groove 32.

In an exemplary embodiment, the composite insulating layer includes a first insulating layer 11, a second insulating layer 12, a third insulating layer 13, and a fourth insulating layer 14 stacked on the substrate 10.

Figure 24:
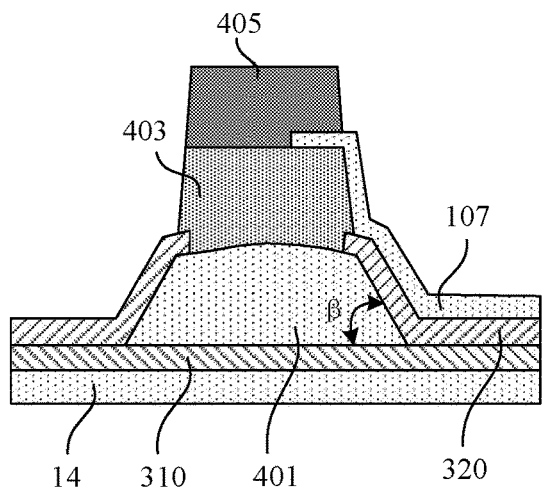
FIG. 24 is an enlarged view of a second isolation dam according to the present disclosure.

FIG. 24 is an enlarged view of a second isolation dam according to the present disclosure. As shown in FIG. 24, the power line 310 is disposed on the fourth insulation layer 14, a first dam foundation 401 is disposed on the power line 310, and the auxiliary power line 320 completely covers a left surface and a right surface of the first dam foundation 401 and partially covers an upper surface of the first dam foundation 401. The auxiliary power line 320 partially covers the upper surface of the first dam foundation 401, which refers that the auxiliary power line 320 covers part of the first surface (a first proximal region) adjacent to the display region and part of the first surface (a first distal region) away from the display region. A region between the first proximal region and the first distal region is where a first deflation structure (a first through hole) is disposed, and the region where the first deflation structure is located exposes the upper surface of the first dam foundation 401. A third dam foundation 403 is disposed on the auxiliary power line 320 located on the first dam foundation 401, the second connection electrode 107 is disposed on the auxiliary power line 320 and covers part of a surface of the third dam foundation 403, and a fifth dam foundation 405 is disposed on the third dam foundation 403. In an exemplary embodiment, an angle β between a left (a right) surface and a lower surface of the first dam foundation 401 may be about 30° to 60°. A thickness of the power line 310 and the auxiliary power line 320 may be about 700 nm to 1000 nm. In some possible implementations, an angle β between the left (the right) surface and the lower surface of the first dam foundation 401 may be about 45°. A thickness of the power line 310 and the auxiliary power line 320 may be about 860 nm.

The description of the structure and preparation process of the display substrate according to the present disclosure is merely illustrative. In an exemplary embodiment, corresponding structures may be adjusted and patterning processes may be added or reduced according to actual needs, which is not limited in the present disclosure.

Figure 25:
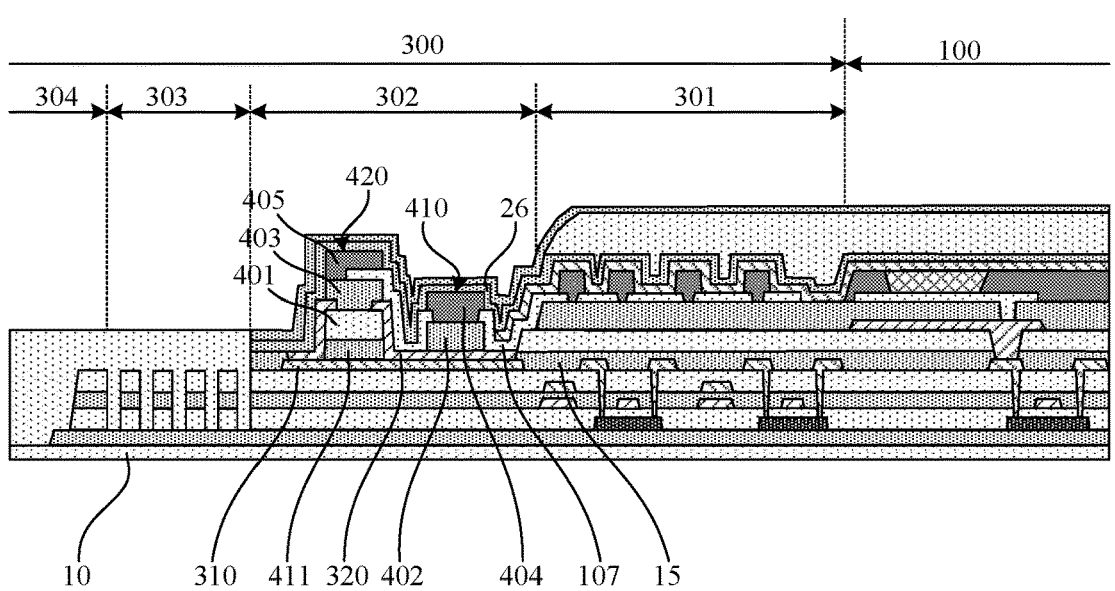
FIG. 25 is a schematic structural diagram of another display substrate according to an exemplary embodiment of the present disclosure.

FIG. 25 is a schematic structural diagram of another display substrate according to an exemplary embodiment of the present disclosure, illustrating a cross-sectional structure of a top-emission OLED display region and a peripheral region. In an exemplary embodiment, a structure of the display region 100 may be basically the same as that in the above embodiments, and structures of the circuit region 301, the crack dam region 303 and the cutting region 304 in the edge region 300 may be basically the same as those in the above embodiments, except for a structure of the isolation dam region 302. In an exemplary embodiment, the first isolation dam 410 of the isolation dam region 302 includes a second dam foundation 402, a second connection electrode 107 and a fourth dam foundation 404 which are stacked in sequence, and the second isolation dam 420 of the isolation dam region 302 includes a first passivation dam foundation 411, a first dam foundation 401, an auxiliary power line 320, a third dam foundation 403 and a fifth dam foundation 405 which are stacked in sequence.

In an exemplary embodiment, an isolation dam region 302 of the edge region 300 includes:
  a substrate 10;
  a composite insulating layer disposed on the substrate 10;
  a power line 310 disposed on the composite insulating layer;
  a fifth insulating layer 15 covering an edge of the power line 310, and a first passivation dam foundation 411 disposed on the power line 310;
  a first dam foundation 401 disposed on the first passivation dam foundation 411, wherein the first passivation dam foundation 411 and the first dam foundation 401 form a first composite dam foundation;
  auxiliary power lines 320 disposed on the power line 310 and the first composite dam foundation, wherein the auxiliary power line 320 covers a first surface of the first composite dam foundation away from the power line 310, a first proximal side adjacent to the display region 100 and a first distal side away from the display region 100; the auxiliary power line 320 on the first composite dam foundation adjacent to the display region 100 and the auxiliary power line 320 on the first composite dam foundation away from the display region 100 are lapped on the power lines 310, and the auxiliary power line 320 covering the first surface of the first composite dam foundation is provided with a first deflation structure;
  a third dam foundation 403 disposed on the auxiliary power line 320 covering the first surface, and a second dam foundation 402 disposed on the auxiliary power line 320 of the first composite dam foundation adjacent to the display region 100;
  second connection electrodes 107 covering a second surface of the second dam foundation 402 away from the power line 310, a second proximal side adjacent to the display region 100, and a second distal side away from the display region 100, a second connection electrode 107 located at a side of the second dam foundation 402 adjacent to the display region 100 and a second connection electrode 107 located at a side of the second dam foundation 402 away from the display region 100 are all lapped on the auxiliary power line 320, wherein the second connection electrode 107 covering the second surface of the second dam base 402 is provided with a second deflation structure;

a fourth dam foundation 404 disposed on the second connection electrode 107 covering the second surface, and a fifth dam foundation 405 disposed on the third dam foundation 403; wherein the second dam foundation 402, the second connection electrode 107 covering the second surface and the fourth dam foundation 404 form a first isolation dam 410, a first passivation dam foundation 411, a first dam foundation 401, and an auxiliary power line 320 covering the first surface, the third dam foundation 403 and the fifth dam foundation 405 form a second isolation dam 420;

an encapsulation layer 26 enclosing the first isolation dam 410 and the second isolation dam 420, wherein the encapsulation layer 26 has an inorganic material/inorganic material laminated structure.

In an exemplary embodiment, a preparation process of the display substrate shown in FIG. 25 may be basically the same as that of the above embodiments, except that during a process of forming the pattern of the fifth insulating layer 15 by patterning process, a first passivation dam foundation 411 is simultaneously formed on the power line 310 of the isolation dam region 302, and the first passivation dam foundation 411 is disposed on a same layer as the fifth insulating layer 15 and formed by a same patterning process.

In an exemplary embodiment, a height of the second isolation dam may be increased, an isolation effect of the second isolation dam on water vapor may be improved, and product quality and service life may be improved by forming the first passivation dam foundation.

Figure 26:
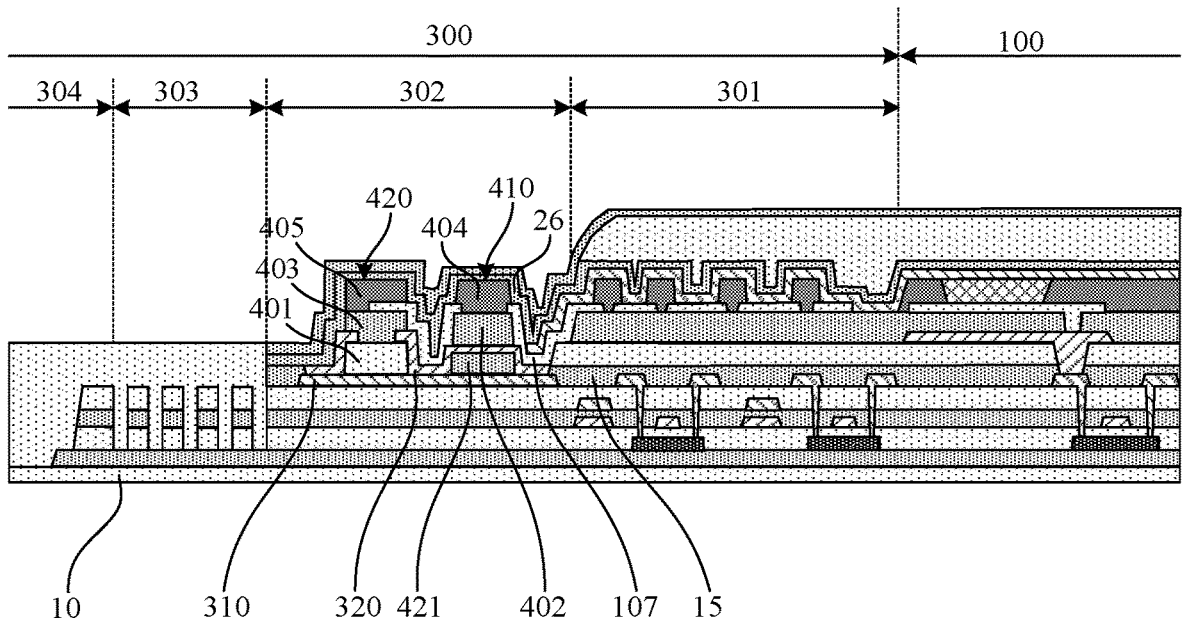
FIG. 26 is a schematic structural diagram of another display substrate according to an exemplary embodiment of the present disclosure.

FIG. 26 is a schematic structural diagram of another display substrate according to an exemplary embodiment of the present disclosure, illustrating a cross-sectional structure of a top-emission OLED display region and a peripheral region. In an exemplary embodiment, a structure of the display region 100 may be basically the same as that in the above embodiments, and structures of the circuit region 301, the crack dam region 303 and the cutting region 304 in the edge region 300 may be basically the same as those in the above embodiments, except for a structure of the isolation dam region 302. In an exemplary embodiment, the first isolation dam 410 of the isolation dam region 302 includes a second passivation dam foundation 421, an auxiliary power line 320, a second dam foundation 402, a second connection electrode 107 and a fourth dam foundation 404 which are stacked in sequence, and the second isolation dam 420 of the isolation dam region 302 includes a first dam foundation 401, an auxiliary power line 320, a third dam foundation 403 and a fifth dam foundation 405 which are stacked in sequence.

In an exemplary embodiment, an isolation dam region 302 of the edge region 300 includes:

a substrate 10;
a composite insulating layer disposed on the substrate 10;
a power line 310 disposed on the composite insulating layer;
a fifth insulating layer 15 covering an edge of the power line 310, and a second passivation dam foundation 421 disposed on the power line 310;

a first dam foundation 401 disposed on the power line 310, wherein a distance between the first dam foundation 401 and the display region 100 is greater than a distance between the second passivation dam foundation 421 and the display region 100;

auxiliary power lines 320 disposed on the power lines 310, the second passivation dam foundation 421 and the first dam foundation 401, the auxiliary power lines 320 respectively covers the second passivation dam foundation 421 and the first dam foundation 401, the auxiliary power line 320 located at a side of the second passivation dam foundation 421 adjacent to the display region 100, the auxiliary power line 320 located at a side of the first dam foundation 401 away from the display region 100 and the auxiliary power line 320 located between the second passivation dam foundation 421 and the first dam foundation 401 are all lapped on the power line 310, wherein the auxiliary power line 320 covering a first surface of the first dam foundation 401 is provided with a first deflation structure;

a third dam foundation 403 disposed on the auxiliary power line 320 covering the first surface and a second dam foundation 402 disposed on the auxiliary power line 320 covering an upper surface of the second passivation dam foundation 421, wherein the second passivation dam foundation 421, the auxiliary power line 320 covering the upper surface of the second passivation dam foundation 421 and the second dam foundation 402 form a second composite dam foundation;

second connection electrodes 107 covering a second surface of the second composite dam foundation away from the power line 310, a second proximal side adjacent to the display region 100 and a second distal side away from the display region 100, wherein the second connection electrode 107 located at a side of the second composite dam foundation adjacent to the display region 100 and the second connection electrode 107 located at a side of the second composite dam foundation away from the display region 100 are lapped on the auxiliary power line 320, and the second connection electrode 107 covering the second surface of the second composite dam foundation is provided with a second deflation structure;

a fourth dam foundation 404 disposed on the second connection electrode 107 covering the second surface, and a fifth dam foundation 405 disposed on the third dam foundation 403; wherein, the second passivation dam foundation 421, the auxiliary power line 320 covering the upper surface of the second passivation dam foundation 421, the second dam foundation 402, the second connection electrode 107 covering the second surface and the fourth dam foundation 404 form a first isolation dam 410, and the first dam foundation 401, the auxiliary power line 320 covering the first surface, the third dam foundation 403 and the fifth dam foundation 405 form a second isolation dam 420;

an encapsulation layer 26 enclosing the first isolation dam 410 and the second isolation dam 420, wherein the encapsulation layer 26 has an inorganic material/inorganic material laminated structure.

In an exemplary embodiment, a preparation process of the display substrate shown in FIG. 26 may be basically the same as that of the above embodiments, except that during a process of forming a pattern of the fifth insulating layer 15 by a patterning process, a second passivation dam foundation 421 is simultaneously formed on the power line 310 of the isolation dam region 302, and the second passivation dam foundation 421 and the fifth insulating layer 15 are disposed on a same layer and formed by a same patterning process.

In an exemplary embodiment, by forming the second passivation dam foundation, a height of the first isolation dam may be increased, an isolation effect of the first isolation dam on water vapor may be improved, and product quality and service life may be improved.

In an exemplary embodiment, structures of FIG. 25 and FIG. 26 may be combined to form the first passivation dam foundation 411 and the second passivation dam foundation 421 on the power line 310 of the isolation dam region 302 at the same time while forming a pattern of the fifth insulating layer 15 through a patterning process. In this way, the first isolation dam 410 of the formed isolation dam region 302 includes a second passivation dam foundation 421, an auxiliary power line 320, a second dam foundation 402, a second connection electrode 107 and a fourth dam foundation 404 which are sequentially disposed, and the second isolation dam 420 of the isolation dam region 302 includes a first passivation dam foundation 411, a first dam foundation 401, an auxiliary power line 320, a third dam foundation 403 and a fifth dam foundation 404, which are sequentially disposed.

Figure 27:
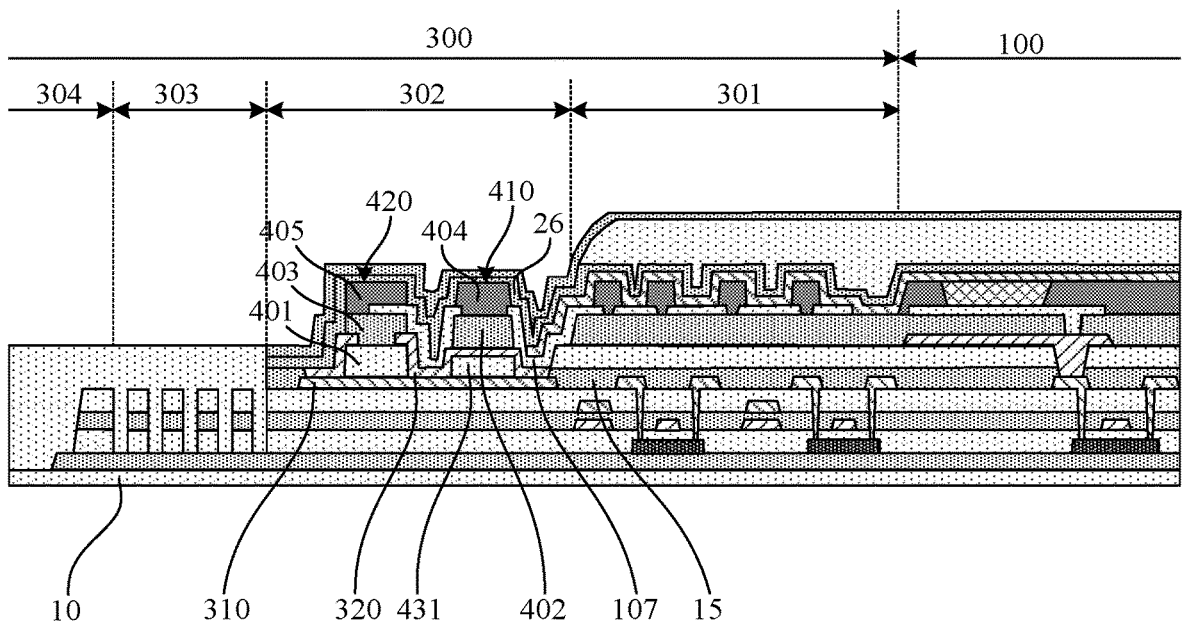
FIG. 27 is a schematic structural diagram of another display substrate according to an exemplary embodiment of the present disclosure.

FIG. 27 is a schematic structural diagram of another display substrate according to an exemplary embodiment of the present disclosure, illustrating a cross-sectional structure of a top-emission OLED display region and a peripheral region. In an exemplary embodiment, a structure of the display region 100 may be basically the same as that in the above embodiments, and structures of the circuit region 301, the crack dam region 303 and the cutting region 304 in the edge region 300 may be basically the same as those in the above embodiments, except for a structure of the isolation dam region 302. In an exemplary embodiment, the first isolation dam 410 of the isolation dam region 302 includes a planarization dam foundation 431, an auxiliary power line 320, a second dam foundation 402, a second connection electrode 107 and a fourth dam foundation 404 which are stacked in sequence, and the second isolation dam 420 of the isolation dam region 302 includes a first dam foundation 401, an auxiliary power line 320, a third dam foundation 403 and a fifth dam foundation 405 which are disposed in sequence.

In an exemplary embodiment, an isolation dam region 302 of the edge region 300 includes:
a substrate 10;
a composite insulating layer disposed on the substrate 10;
a power line 310 disposed on the composite insulating layer;
a fifth insulating layer 15 covering an edge of the power line 310;
a first dam foundation 401 and a planarization dam foundation 431 disposed on the power line 310. A distance between the planarization dam foundation 431 and the display region 100 is smaller than that between the first dam foundation 401 and the display region 100, and a thickness of the planarization dam foundation 431 is smaller than that of the first dam foundation 401.
auxiliary power lines 320 disposed on the power lines 310, the planarization dam foundation 431 and the first dam foundation 401, the auxiliary power lines 320 respectively cover the planarization dam foundation 431 and the first dam foundation 401, the auxiliary power line 320 located at a side of the planarization dam foundation 431 adjacent to the display region 100, the auxiliary power line 320 located at a side of the first dam foundation 401 away from the display region 100 and the auxiliary power line 320 located between the planarization dam foundation 431 and the first dam foundation 401 are all lapped on the power line 310, wherein the auxiliary power line 320 covering a first surface of the first dam foundation 401 is provided with a first deflation structure;
a third dam foundation 403 disposed on the auxiliary power line 320 covering the first surface and a second dam foundation 402 disposed on an upper surface of the planarization dam foundation 431, wherein the planarization dam foundation 431, the auxiliary power line 320 covering the planarization dam foundation 431 and the second dam foundation 402 form a third composite dam foundation;
second connection electrodes 107 covering a second surface of the third composite dam foundation away from the power line 310, a second proximal side adjacent to the display region 100 and a second distal side away from the display region 100, wherein the second connection electrode 107 located at a side of the third composite dam foundation adjacent to the display region 100 and the second connection electrode 107 located at a side of the third composite dam foundation away from the display region 100 are lapped on the auxiliary power line 320, and the second connection electrode 107 covering the second surface of the third composite dam foundation is provided with a second deflation structure;
a fourth dam foundation 404 disposed on the second connection electrode 107 covering the second surface, and a fifth dam foundation 405 disposed on the third dam foundation 403; wherein, the planarization dam foundation 431, the auxiliary power line 320 covering the upper surface of the planarization dam foundation 431, the second dam foundation 402, the second connection electrode 107 covering the second surface and the fourth dam foundation 404 form a first isolation dam 410, and the first dam foundation 401, the auxiliary power line 320 covering the first surface, the third dam foundation 403 and the fifth dam foundation 405 form a second isolation dam 420;
an encapsulation layer 26 enclosing the first isolation dam 410 and the second isolation dam 420, wherein the encapsulation layer 26 has an inorganic material/inorganic material laminated structure.

In an exemplary embodiment, a preparation process of the display substrate shown in FIG. 27 can be basically the same as that of the above embodiment, except that during the process of forming a pattern of a first planarization layer 16 by a patterning process, a first dam foundation 401 and a planarization dam foundation 431 are formed on the power line 310 of the isolation dam region 302 at the same time, and the first dam foundation 401 and the planarization dam foundation 431 are disposed on a same layer and formed by the same patterning process. In an exemplary embodiment, a thickness of the planarization dam foundation 431 may be smaller than that of the first dam foundation 401 by using a patterning process of halftone or gray tone mask. In an exemplary embodiment, the thickness of the planarization dam foundation 431 may be about 30% to 70% of the thickness of the first dam foundation 401.

In an exemplary embodiment, by forming planarization dam foundation, a height of the first isolation dam may be increased, an isolation effect of the first isolation dam on water vapor may be improved, and product quality and service life may be improved.

The present disclosure also provides a method for preparing a display substrate, which includes a display region and an edge region located around the display region; FIG. 28 is a flow chart of a preparation method for a display substrate according to an exemplary embodiment of the present disclosure, as shown in FIG. 28, in an exemplary embodiment, the preparation method includes:

S1. forming a composite insulating layer and a power line disposed on the composite insulating layer in an edge region of a substrate;

S2. forming an isolation dam on a side of the power line away from the substrate, wherein the isolation dam is provided with an auxiliary power line, and both an auxiliary power line of the isolation dam adjacent to the display region and an auxiliary power line of the isolation dam away from the display region are lapped on the power line.

In an exemplary embodiment, the composite insulating layer may include a first insulating layer, a second insulating layer, a third insulating layer and a fourth insulating layer which are stacked.

In an exemplary embodiment, step S2 may include:

forming a first dam foundation on the power line;

forming auxiliary power lines on the power lines and the first dam foundation, wherein a first side of the auxiliary power line adjacent to the display region and a second side of the auxiliary power line away from the display region are lapped on the power line, and an auxiliary power line between the first side and the second side cover the first dam foundation;

forming a second dam foundation and a third dam foundation, wherein the third dam foundation is disposed on an auxiliary power line covering the first dam foundation, and the second dam foundation is disposed on an auxiliary power line between the first dam foundation and the display region;

forming a second connection electrode lapped with the auxiliary power line, wherein the second connection electrode covers the second dam foundation;

forming a fourth dam foundation and a fifth dam foundation, wherein the fourth dam foundation is disposed on the second connection electrode covering the second dam foundation, and the fifth dam foundation is disposed on the third dam foundation; the second dam foundation, the second connection electrode and the fourth dam foundation form a first isolation dam, and the first dam foundation, the auxiliary power line, the third dam foundation and the fifth dam foundation form a second isolation dam.

The present disclosure provides a preparation method of a display substrate. By forming a power line and an auxiliary power line in an edge region, and through a connection structure in which the auxiliary power line crosses a second isolation dam and laps with a power line, a double-layer power wiring in a parallel structure is achieved, a resistance of a power wiring in the edge region is reduced, voltage drop of a voltage signal is reduced to the maximum extent, and display brightness uniformity in the display region and display quality are improved. According to the exemplary embodiment of the present disclosure, a first deflation structure and a second deflation structure are respectively disposed on the auxiliary power line and the second connection electrode, and the first and second deflation structures form a deflation channel, so that gases generated by a planarization layer may be effectively discharged in the process, thereby avoiding peeling of a film layer and improving process quality. The preparation method of the display substrate in the exemplary embodiment of the present disclosure has good process compatibility, simple process realization, easy implementation, high production efficiency, low production cost and high yield rate.

The present disclosure further provides a display apparatus including the display substrate in the aforementioned embodiments. The display apparatus may be any product or component with a display function such as a mobile phone, a tablet computer, a television, a display, a laptop, a digital photo frame, a navigator, etc.

Although the embodiments disclosed in the present disclosure are as described above, the described contents are only the embodiments for facilitating understanding of the present disclosure, which are not intended to limit the present disclosure. Any person skilled in the field to which the present disclosure pertains may make any modifications and variations in the forms and details of implementation without departing from the spirit and the scope disclosed by the present disclosure. However, the patent protection scope of the present disclosure shall still be subject to the scope defined in the appended claims.

What is claimed is:

1. A display substrate, comprising:
a display region and an edge region located around the display region; the edge region comprises a composite insulating layer disposed on a substrate, a power line disposed on the composite insulating layer and an isolation dam disposed on the power line, wherein the isolation dam is provided with auxiliary power lines, and an auxiliary power line located at a side of the isolation dam adjacent to the display region and an auxiliary power line located at a side of the isolation dam away from the display region are connected on the power line.

2. The display substrate of claim 1, wherein the isolation dam comprises a first isolation dam and a second isolation dam; the second isolation dam is disposed on the power line, and the first isolation dam is disposed on an auxiliary power line at a side of the second isolation dam adjacent to the display region; the second isolation dam is provided with the auxiliary power lines, and an auxiliary power line located at a side of the second isolation dam adjacent to the display region and an auxiliary power line located at a side of the second isolation dam away from the display region are both connected on the power line.

3. The display substrate of claim 2, wherein the edge region further comprises second connection electrodes, which are disposed in the first isolation dam, and a second connection electrode located at a side of the first isolation dam adjacent to the display region and a second connection electrode located at a side of the first isolation dam away from the display region are connected on the auxiliary power line.

4. The display substrate of claim 2, wherein the second isolation dam further comprises a first dam foundation, a third dam foundation and a fifth dam foundation, wherein the first dam foundation is disposed on the power line, and comprises a first surface away from the power line, a first proximal side adjacent to the display region and a first distal side away from the display region; the auxiliary power lines all cover the first surface, the first proximal surface and the first distal surface of the first dam foundation; the third dam foundation is disposed on the auxiliary power line covering the first surface, and the fifth dam foundation is disposed on the third dam foundation.

5. The display substrate of claim 2, wherein the second isolation dam further comprises a first dam foundation, a third dam foundation and a fifth dam foundation; the first dam foundation is disposed on the power line, and comprises a first surface away from the power line, a first proximal side adjacent to the display region and a first distal side away from the display region; the auxiliary power lines all cover the first proximal side and the first distal side of the first dam foundation and partially cover the first surface of the first dam foundation, the third dam foundation is disposed on the auxiliary power lines partially covering the first surface, and the fifth dam foundation is disposed on the third dam foundation; or, the auxiliary power lines all cover the first proximal side and the first distal side of the first dam foundation, the third dam foundation is disposed on the first surface of the first dam foundation, and the fifth dam foundation is disposed on the third dam foundation.

6. The display substrate of claim 5, wherein an auxiliary power line in the second isolation dam is provided with a first deflation structure, and an orthographic projection of the first deflation structure on the substrate is within an orthographic projection range of the first surface on the substrate.

7. The display substrate of claim 6, wherein the first deflation structure comprises at least one first through hole, and a first length of the first through hole is 80%-100% of a first length of the first surface, a second length of the first through hole is 20%-60% of the first length of the first through hole, and a distance between adjacent first through holes is 20%-60% of the first length of the first through hole; the first length is a feature size along a direction away from the display region, and the second length is a feature size along an edge direction of the display region.

8. The display substrate of claim 3, wherein the first isolation dam further comprises a second dam foundation and a fourth dam foundation; the second dam foundation is disposed on the auxiliary power line, and comprises a second surface away from the power line, a second proximal side adjacent to the display region and a second distal side away from the display region; the second connection electrode completely covers the second surface, the second proximal side and the second distal side of the second dam foundation; the fourth dam foundation is disposed on the second connection electrode covering the second surface.

9. The display substrate of claim 3, wherein the first isolation dam further comprises a second dam foundation and a fourth dam foundation; the second dam foundation is disposed on the auxiliary power line, and comprises a second surface away from the power line, a second proximal side adjacent to the display region and a second distal side away from the display region; the second connection electrode completely covers the second proximal side and the second distal side of the second dam foundation, partially covers the second surface of the second dam foundation, and the fourth dam foundation is disposed on the second connection electrode partially covering the second surface; or, the second connection electrode completely covers the second proximal side and the second distal side of the second dam foundation, and the fourth dam foundation is disposed on the second surface of the second dam foundation.

10. The display substrate of claim 9, wherein the second connection electrode in the first isolation dam is provided with a second deflation structure, and an orthographic projection of the second deflation structure on the substrate is within an orthographic projection range of the second surface on the substrate.

11. The display substrate of claim 10, wherein the second deflation structure comprises at least one second through hole, and a first length of the second through hole is 80% to 100% of a first length of the second surface, a second length of the second through hole is 20% to 60% of the first length of the second through hole, and a distance between adjacent second through holes is 20% to 60% of the first length of the second through hole; the first length is a feature size along a direction away from the display region, and the second length is a feature size along an edge direction of the display region.

12. The display substrate of claim 4, wherein the second isolation dam further comprises a first passivation dam foundation; the first passivation dam foundation is disposed on the power line, and the first dam foundation is disposed on the first passivation dam foundation.

13. The display substrate of claim 8, wherein the first isolation dam further comprises a second passivation dam foundation; the second passivation dam foundation is disposed on the power line, and the auxiliary power line covers the second passivation dam foundation; and the second dam foundation is disposed on the auxiliary power line covering the second passivation dam foundation.

14. The display substrate of claim 8, wherein the first isolation dam further comprises a second passivation dam foundation, and the second isolation dam further comprises a first passivation dam foundation; the second passivation dam foundation is disposed on the power line, the auxiliary power line covers the second passivation dam foundation and the second dam foundation is disposed on the auxiliary power line covering the second passivation dam foundation; the first passivation dam foundation is disposed on the power line, and the first dam foundation is disposed on the first passivation dam foundation.

15. The display substrate of claim 8, wherein the first isolation dam further comprises a planarization dam foundation; the planarization dam foundation is disposed on the power line, and the auxiliary power line covers the planarization dam foundation; the second dam foundation is disposed on the auxiliary power line covering the planarization dam foundation; the planarization dam foundation is disposed in a same layer as the first dam foundation, and a thickness of the planarization dam foundation is 30% to 70% of a thickness of the first dam foundation.

16. The display substrate of claim 15, wherein the planarization dam foundation is disposed in a same layer as the first dam foundation, and the thickness of the planarization dam foundation is 30% to 70% of the thickness of the first dam foundation.

17. The display substrate of claim 3, wherein the display region comprises a drive structure layer disposed on the substrate and light emitting elements disposed on the drive structure layer; the power line is disposed in a same layer as a first source and drain metal layer of the drive structure layer, the auxiliary power line is disposed in a same layer as a second source and drain metal layer of the drive structure and the second connection electrode is disposed in a same layer as an anode of the light emitting element.

18. A display apparatus, comprising the display substrate of claim 1.

19. A preparation method for a display substrate, wherein the display substrate comprises a display region and an edge region located around the display region; the preparation method comprises:
  forming a composite insulating layer and a power line disposed on the composite insulating layer in the edge region of a substrate;

forming an isolation dam on a side of the power line away from the substrate, wherein the isolation dam is provided with an auxiliary power lines, and both an auxiliary power line located at a side of the isolation dam adjacent to the display region and an auxiliary power line located at a side of the isolation dam away from the display region are connected on the power line.

20. The preparation method of claim 19, wherein forming the isolation dam on the power line, the isolation dam being provided with the auxiliary power lines comprises:

forming a first dam foundation on the power line;

forming the auxiliary power lines on the power line and the first dam foundation, wherein a first side of the auxiliary power line adjacent to the display region and a second side of the auxiliary power line away from the display region are connected on the power line, and an auxiliary power line between the first side and the second side cover the first dam foundation;

forming a second dam foundation and a third dam foundation, wherein the third dam foundation is disposed on an auxiliary power line covering the first dam foundation, and the second dam foundation is disposed on an auxiliary power line between the first dam foundation and the display region;

forming a second connection electrode connected with the auxiliary power line, wherein the second connection electrode covers the second dam foundation;

forming a fourth dam foundation and a fifth dam foundation, wherein the fourth dam foundation is disposed on the second connection electrode covering the second dam foundation, and the fifth dam foundation is disposed on the third dam foundation; the second dam foundation, the second connection electrode and the fourth dam foundation form a first isolation dam, and the first dam foundation, the auxiliary power line, the third dam foundation and the fifth dam foundation form a second isolation dam.

* * * * *